United States Patent
Okamura

(10) Patent No.: US 10,097,205 B2
(45) Date of Patent: Oct. 9, 2018

(54) TRANSMISSION DEVICE, RECEPTION DEVICE, TRANSMISSION METHOD, AND RECEPTION METHOD FOR SUPPRESSING THE DEGRADING OF DECODING PERFORMANCE DUE TO COMBINATIONS OF ELIMINATIONS AT THE BIT LEVEL

(71) Applicant: Panasonic Intellectual Property Management Co., Ltd., Osaka (JP)

(72) Inventor: Shutai Okamura, Osaka (JP)

(73) Assignee: SUN PATENT TRUST, New York, NY (US)

(*) Notice: Subject to any disclaimer, the term of this patent is extended or adjusted under 35 U.S.C. 154(b) by 0 days.

(21) Appl. No.: 14/598,770

(22) Filed: Jan. 16, 2015

(65) Prior Publication Data

US 2015/0128013 A1    May 7, 2015

Related U.S. Application Data

(63) Continuation of application No. 13/263,013, filed as application No. PCT/JP2011/000724 on Feb. 9, 2011, now Pat. No. 9,077,377.

(30) Foreign Application Priority Data

Feb. 10, 2010 (JP) ................. 2010-027987

(51) Int. Cl.
  *H03M 13/27* (2006.01)
  *H03M 13/11* (2006.01)
  (Continued)

(52) U.S. Cl.
  CPC .... *H03M 13/1117* (2013.01); *H03M 13/1102* (2013.01); *H03M 13/1142* (2013.01);
  (Continued)

(58) Field of Classification Search
  None
  See application file for complete search history.

(56) References Cited

U.S. PATENT DOCUMENTS 4,901,319 A    2/1990 Ross
6,067,646 A *  5/2000 Starr ............... H04L 1/0001
                                          714/701

(Continued)

FOREIGN PATENT DOCUMENTS

JP    1-190143    7/1989
JP    2000-244464  9/2000
(Continued)

OTHER PUBLICATIONS

International Search Report dated Apr. 26, 2011 in International Application No. PCT/JP2011/000724.
(Continued)

*Primary Examiner* — Justin R Knapp
(74) *Attorney, Agent, or Firm* — Wenderoth, Lind & Ponack, L.L.P.

(57) ABSTRACT

In a transmission device, a determining unit determines, for use in transmission, an LDPC encoding method corresponding to occurrence conditions of external noise from a plurality of LDPC encoding methods each having the same code length and the same code rate and being defined by a different parity check matrix, and an encoding unit generates a codeword bit sequence by encoding transmission data using the LDPC encoding method determined by the determining unit.

4 Claims, 19 Drawing Sheets

(51) Int. Cl.
    *H04L 1/00*     (2006.01)
    *H03M 13/00*     (2006.01)
    *H03M 13/35*     (2006.01)
    *H04B 1/69*     (2011.01)

(52) U.S. Cl.
    CPC ..... *H03M 13/2767* (2013.01); *H03M 13/353* (2013.01); *H03M 13/6527* (2013.01); *H03M 13/6544* (2013.01); *H04B 2001/6908* (2013.01)

(56) References Cited

U.S. PATENT DOCUMENTS

| | | | |
|---|---|---|---|
| 6,631,491 B1 * | 10/2003 | Shibutani | H03M 13/23 714/759 |
| 7,409,626 B1 * | 8/2008 | Schelstraete | H03M 13/2732 370/468 |
| 7,436,901 B2 * | 10/2008 | Tynderfeldt et al. | 375/299 |
| 8,149,942 B1 * | 4/2012 | Wang et al. | 375/267 |
| 8,156,389 B2 * | 4/2012 | Palanki | H03M 13/2757 714/701 |
| 8,316,287 B1 | 11/2012 | Varnica et al. | |
| 2004/0123228 A1 | 6/2004 | Kikuchi et al. | |
| 2004/0186992 A1 | 9/2004 | Matsumoto | |
| 2005/0037722 A1 | 2/2005 | Koga et al. | |
| 2005/0180459 A1 | 8/2005 | Watson | |
| 2006/0156169 A1 * | 7/2006 | Shen | H03M 13/1148 714/752 |
| 2006/0221807 A1 | 10/2006 | Fukuoka et al. | |
| 2007/0019752 A1 | 1/2007 | Kim | |
| 2008/0095253 A1 | 4/2008 | Koga et al. | |
| 2009/0019333 A1 | 1/2009 | McEvoy et al. | |
| 2009/0109999 A1 | 4/2009 | Kuri et al. | |
| 2009/0249166 A1 | 10/2009 | Miki et al. | |
| 2009/0290544 A1 | 11/2009 | Yano et al. | |
| 2010/0218066 A1 | 8/2010 | Okamura et al. | |
| 2010/0226446 A1 | 9/2010 | Koga et al. | |
| 2010/0262888 A1 | 10/2010 | Choi et al. | |
| 2012/0089890 A1 * | 4/2012 | Palanki et al. | 714/776 |
| 2012/0233524 A1 | 9/2012 | Varnica et al. | |
| 2013/0232389 A1 | 9/2013 | Varnica et al. | |

FOREIGN PATENT DOCUMENTS

| | | |
|---|---|---|
| JP | 2003-198383 | 7/2003 |
| JP | 2004-88468 | 3/2004 |
| JP | 2008-053862 | 3/2008 |
| JP | 2009-55603 | 3/2009 |
| JP | 2009-164759 | 7/2009 |
| JP | 4356392 | 8/2009 |
| WO | 2005/006622 | 1/2005 |
| WO | 2007/020996 | 2/2007 |
| WO | 2007/080727 | 7/2007 |
| WO | 2008/093423 | 8/2008 |
| WO | 2009/004601 | 1/2009 |
| WO | 2009/104898 | 8/2009 |

OTHER PUBLICATIONS

English Abstract of "Parameter Estimation and Error Rate Performance of Optimum Receiver under Class-A Impulsive Radio Noise Environment", Hideki Kanemoto et al., The Institute of Electronics, Information, and Communication Engineers, Journal B, vol. J82-B, No. 12, pp. 2364-2374, Dec. 1999.

Liang Zhang et al., "Turbo Decoding with Erasures for High-Speed Transmission in the Presence of Impulse Noise", 2002 International Zurich Seminar on Broadband Communications, pp. 20-1 to 20-6, Feb. 2002.

Changyan Di et al., "Finite-Length Analysis of Low-Density Parity-Check Codes on the Binary Erasure Channel", IEEE Transaction on Information Theory, vol. 48, No. 6, Jun. 2002, pp. 1570-1579.

Extended European Search Report dated Oct. 17, 2013 in corresponding European Application No. 11742030.7.

Massimo Rovini et al., "A Scalable Decoder Architecture for IEEE 802.11n LDPC Codes", Global Telecommunications Conference, 2007, GLOBECOM '07, IEEE, IEEE, Piscataway, NJ, USA, Nov. 1, 2007, pp. 3270-3274, XP031196548, ISBN: 978-1-4244-1042-2.

Enver Cavus et al., "A Performance Improvement and Error Floor Avoidance Technique for Belief Propagation Decoding of LDPC Codes", 2005 IEEE 16$^{th}$ International Symposium on Personal, Indoor and Mobile Radio Communications: Sep. 11-14, 2005, Berlin, Germany, IEEE Operations Center, Piscataway, NJ, Sep. 11, 2005, XP002538103, ISBN: 978-3-8007-2909-8, Retrieved from the Internet: URL: http://ieeexplore.ieee.org/stamp/stamp.jsp?tp=&arnumber=1651870&isnumber=34629 [retrieved on Jan. 1, 2005].

Tadashi Wadayama, "Greedy Construciton of LDPC Codes for Burst Erasure Channel", Institute of Electronics, Information, and Communication Engineers, Technical Report of IEICE, IT2004-44, Sep. 2004, pp. 35-40.

* cited by examiner

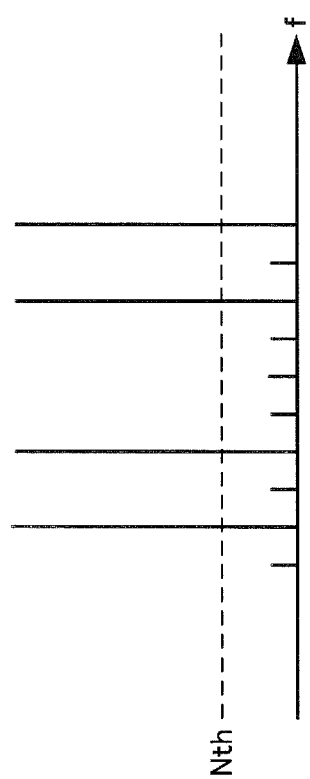

TRANSMISSION DEVICE, RECEPTION DEVICE, TRANSMISSION METHOD, AND RECEPTION METHOD FOR SUPPRESSING THE DEGRADING OF DECODING PERFORMANCE DUE TO COMBINATIONS OF ELIMINATIONS AT THE BIT LEVEL

TECHNICAL FIELD

The present invention relates to transmission and reception devices that communicate digitally in an environment with strong external noise and to transmission and reception methods for the same.

BACKGROUND ART

Currently, products that conform to the IEEE 802.11b/g/n wireless Local Area Network (LAN) standards and use the 2.4 GHz Industry-Science-Medical (ISM) band are becoming widespread as infrastructure in home networks. In Japan, the ISM band is a frequency bandwidth open for unlicensed use at powers equal to or less than 10 mW. In addition to wireless LAN standards, other communications systems such as ZigBee, Bluetooth, and cordless telephones also use the ISM band. As a result, signals from other communications systems sometimes interfere with wireless LAN communication. Artificial noise emitted from electrical appliances that use high-frequency devices, such as microwave ovens, is also known to appear in the ISM band.

Other than wireless LANs, a Power Line Communication (PLC) system using power lines as a communication medium are a known form of infrastructure in home networks. A PLC system communicates by impressing a communications signal on a power line at a low or high frequency not being used for power transfer. However, these frequency bands are subject to interference from a plurality of communications devices that perform PLC with different communication methods, noise produced by electronic devices connected to the power line, broadcast waves from broadcasting stations, electric radiation leaked from external electronic devices, and the like.

As a result, the channel between a transmission device and a reception device in a wireless communication system or a PLC system that use the ISM band is greatly influenced by artificial noise and interference from other systems. In the present description, interference from other systems, artificial noise from electronic devices, and the like are collectively referred to as external noise. Typically, external noise is characterized by having a large power level and by appearing at a specific time and a specific frequency. Therefore, a reception device designed with the assumption of communicating in an environment of Additive White Gaussian Noise (AWGN) produced at the reception device cannot perform optimal reception in an environment in which external noise exists, and bit error rate characteristics degrade. As a result, the throughput of the communications system decreases.

To address the above problem, the question of optimal reception in an environment of external noise, such as impulse noise, has been studied. For example, Non-Patent Literature 1 discloses a method for optimal reception that estimates necessary parameters when using a Middleton class A impulsive radio noise model as a statistical model for external noise. However, with the method disclosed in Non-Patent Literature 1, additional calculation for estimation of parameters for external noise is necessary.

Non-Patent Literature 2 proposes a simpler method that estimates a symbol on which external noise is imposed and sets the log likelihood ratio (LLR) of bits included in the symbol to zero during demodulation and decoding. With this method, when calculating the LLR to input into the decoder, if the LLR for a bit is larger than a predetermined threshold, the bit is determined to have been influenced by powerful external noise, and the LLR is set to 0 for decoding. In this way, reception in an external noise environment is achieved with a relatively simple approach.

CITATION LIST

Patent Literature

Patent Literature 1: Japanese Patent Application Publication No. H01-190143
Patent Literature 2: Japanese Patent Application Publication No. 2000-244464
Patent Literature 3: Japanese Patent No. 4356392

Non-Patent Literature

Non-Patent Literature 1: Hideki KANEMOTO, Shinichi MIYAMOTO, Norihiko MORINAGA, "Parameter Estimation and Error Rate Performance of Optimum Receiver under Class-A Impulsive Radio Noise Environment", The Institute of Electronics, Information, and Communication Engineers, Journal B Vol. J82-B, No. 12, pp. 2364-2374, December 1999.
Non-Patent Literature 2: Liang Zhang and Abbas Yongacoglu, "Turbo Decoding with Erasures for High-Speed Transmission in the Presence of Impulse Noise", 2002 International Zurich Seminar on Broadband Communications, pp. 20-1-20-6, Feb. 2002.
Non-Patent Literature 3: Changyan Di, David Proietti, I. Emre Telatar, Thomas J. Richardson, and Rudiger L. Urbanke, "Finite-Length Analysis of Low-Density Parity-Check Codes on the Binary Erasure Channel", IEEE Transaction on Information Theory, vol. 48, No. 6, June 2002.

SUMMARY OF INVENTION

Technical Problem

The IEEE 802.11n standard, which is expected to gain popularity as a wireless LAN standard, the IEEE 802.16e standard for outdoor wireless broadband service, and some of the standards for PLC systems adopt the Low-Density Parity-Check (LDPC) code as an error correction code. The LDPC code is defined by a low-density parity check matrix and is known for having a high error correction capability approaching the Shannon limit. Note that "low-density" means that the number of nonzero elements in the parity check matrix is extremely low as compared to the number of zero elements.

For decoding of an LDPC code, sum-product decoding based on a belief propagation algorithm is typically used. The following describes sum-product decoding for an AWGN channel with an average 0 and variance $\sigma^2$.

FIG. 1 shows a model of encoding and decoding for an AWGN channel. An LDPC encoder 1100 encodes K transmission information bits $(b_1, \ldots, b_K)$ using a parity check matrix H to obtain N codeword bits $(c_1, \ldots, c_N)$. Expression 1 shows an example of the parity check matrix H.

[Math 1]

$$H = \begin{pmatrix} 1 & 1 & 0 & 1 & 1 & 1 & 1 & 0 & 0 & 0 \\ 1 & 1 & 0 & 0 & 1 & 0 & 0 & 1 & 1 & 1 \\ 1 & 0 & 1 & 0 & 1 & 0 & 1 & 0 & 1 & 1 \\ 0 & 1 & 1 & 1 & 0 & 1 & 0 & 1 & 1 & 0 \\ 0 & 0 & 1 & 1 & 0 & 1 & 1 & 1 & 0 & 1 \end{pmatrix} \quad \text{Expression 1}$$

The parity check matrix H shown in Expression 1 is a five-row by ten-column parity check matrix defining an LDPC code with a code length of 10 and a code rate of 1/2. The parity check matrix H in Expression 1 is small, for the sake of illustration, and therefore is not low density.

LDPC encoding using the parity check matrix H in Expression 1 is performed with any algorithm that obtains a codeword $C=(c_1, \ldots, c_N)$ satisfying $HC^T=0$. In the case of a systematic code, $(c_1, \ldots, c_N)=(b_1, \ldots, b_K, P_1, \ldots, P_M)$. In this case, $(p_1, \ldots, p_M)$ are parity bits generated by LDPC encoding.

FIG. 2 shows the parity check matrix H in Expression 1 represented as a Tanner graph. A Tanner graph is a two-part graph composed of variable nodes equal in number to the columns of the parity check matrix H, check nodes equal in number to the rows of the parity check matrix H, and edges equal in number to the nonzero elements included in the parity check matrix H. The variable nodes and the check nodes are independent computing units. When the element at the $m^{th}$ row and the $n^{th}$ column of the parity check matrix H is nonzero, the $m^{th}$ check node and the $n^{th}$ variable node in the Tanner graph are connected by an edge.

A modulator 1200 modulates N codeword bits $(c_1, \ldots, c_N)$. In the case of Binary Phase Shift Keying (BPSK), a modulated symbol $x_n$ corresponding to the codeword bit $c_n$ is provided by $x_n=-2c_n+1$. In other words, when $c_n$ is 0, $x_n$ is 1, and when $c_n$ is 1, $x_n$ is −1.

The modulated symbol is received by a device at the reception end after undergoing the influence of AWGN with an average 0 and variance $\sigma^2$ in the AWGN channel 1300. The received symbol $y_n$ is provided by $y_n=x_n+z_n$, where $z_n$ is the AWGN component.

A demodulator 1400 determines an LLR $\lambda_n$ for each codeword bit from the received symbol $y_n$. In the case of BPSK, $\lambda_n$ is provided by $\lambda_n=2y_n/\sigma^2$.

An LDPC decoder 1500 receives the LLR as an input and performs sum-product decoding. An M-row by N-column parity check matrix H is set as the parity check matrix for the LDPC code to be decoded. In this case, K=N−M. The element at the $m^{th}$ row and the $n^{th}$ column of the parity check matrix H is represented as $H_{m, n}$. Subsets A(m), B(n) of the set [1, N] are defined as follows by Expressions 2 and 3.

[Math 2]

$$A(m)=\{n:H_{m,n}=1\} \quad \text{Expression 2}$$

[Math 3]

$$B(n)=\{m:H_{m,n}=1\} \quad \text{Expression 3}$$

In other words, the subset A(m) represents the set of column indices of 1's in the $m^{th}$ row of the parity check matrix H, and the subset B(n) represents the set of row indices of 1's in the $n^{th}$ column of the parity check matrix H. Furthermore, Expression 4 represents the remaining elements $n^{th}$ after removal of elements n from the subset A(m).

[Math 4]

$$n' \in A(m)\backslash n \quad \text{Expression 4}$$

Similarly, Expression 5 represents the remaining elements m' after removal of elements m from the subset B(n).

[Math 5]

$$m' \in B(n)\backslash m \quad \text{Expression 5}$$

Sum-product decoding is performed through the following steps 1-6.

Step 1 (Initialization)

The LDPC decoder 1500 sets a variable q, a counter of the number of iterations, to 1 and sets the maximum number of iterations to Q.

Step 2 (Column Processing/Variable Node Processing)

In the LDPC decoder 1500, each variable node determines a priori values $\beta_{m,\,n}$ by iteratively decoding the code using the input LLR $\lambda_n$ and an extrinsic value $\alpha_{m,\,n}$. Each variable node updates the a priori values $\beta_{m,\,n}$ using the following updating Expression 6 in the order n=1, 2, ..., N for every combination (m, n) satisfying $H_{m,\,n}=1$. However, the variable nodes perform the calculation in Expression 6 with $\alpha_{m,\,n}=0$ only when q=1. When q≠1, the variable nodes perform the calculation in Expression 6 using the value of the extrinsic value $\alpha_{m,\,n}$ updated in step 3 described below.

[Math 6]

$$\beta_{m,n} = \lambda_n + \sum_{m' \in B(n)/m} \alpha_{m',n} \quad \text{Expression 6}$$

FIG. 3 shows an example of variable node processing in the Tanner graph. In FIG. 3, check nodes for m=1, 2, 3 are connected to the variable node for n=5. This means that in the fifth column of the parity check matrix H in Expression 1, the first, second, and third rows satisfy $H_{m,\,n}=1$. The variable node for n=5 determines a priori values $\beta_{1,5}$, $\beta_{2,5}$, and $\beta_{3,\,5}$ respectively for m=1, 2, 3 using Expression 6. The a priori values $\beta_{1,5}$, $\beta_{2,5}$, and $\beta_{3,\,5}$ become Expression 7. Note that FIG. 3 shows the example of calculation for m=1.

[Math 7]

$$\beta_{1,5}=\lambda_5+\alpha_{2,5}+\alpha_{3,5}$$

$$\beta_{2,5}=\lambda_5+\alpha_{1,5}+\alpha_{3,5}$$

$$\beta_{3,5}=\lambda_5+\alpha_{1,5}+\alpha_{2,5} \quad \text{Expression 7}$$

The LLR $\lambda_n$ is the log-likelihood ratio for whether the $n^{th}$ codeword bit obtained from the channel is 0 or 1, and the extrinsic value $\alpha_{m,\,n}$ is the log-likelihood ratio of whether the $n^{th}$ codeword bit obtained from the $m^{th}$ check node is 0 or 1.

The $n^{th}$ variable node determines the likelihood of whether the $n^{th}$ codeword bit is 0 or 1 from the LLR $\lambda_n$ and $\alpha_{m',\,n}$ and outputs the result to the $m^{th}$ check node as the a priori value $\beta_{m,\,n}$.

Step 3 (Row Processing/Check Node Processing)

In the LDPC decoder 1500, each check node determines extrinsic values $\alpha_{m,\,n}$ by decoding a single parity check code using the a priori values $\beta_{m,\,n}$ transmitted from the variable nodes. Each check node updates the extrinsic values $\alpha_{m,\,n}$ using the following updating Expression 8 in the order m=1, 2, ..., M for every combination (m, n) satisfying $H_{m,\,n}=1$.

[Math 8]

$$\alpha_{m,n} = 2\tanh^{-1}\left(\prod_{n' \in A(m)\backslash n} \tanh\left(\frac{\beta_{m,n'}}{2}\right)\right) \quad \text{Expression 8}$$

FIG. 4 shows an example of check node processing in the Tanner graph. In FIG. 4, variable nodes for n=1, 3, 5, 7, 9, 10 are connected to the check node for m=3. This means that in the third row of the parity check matrix H in Expression 1, the first, third, fifth, seventh, ninth, and tenth rows satisfy $H_{m,n}=1$. The check node for m=3 determines extrinsic values $\alpha_{3,1}, \alpha_{3,3}, \alpha_{3,5}, \alpha_{3,7}, \alpha_{3,9}$, and $\alpha_{3,10}$ respectively for n=1, 3, 5, 7, 9, and 10 using Expression 8. Note that FIG. 4 shows the example of calculation for n=1.

Step 4 (Calculation of Tentative Estimated Codeword)

The LDPC decoder 1500 determines a posteriori LLR $\Lambda_n$ for n∈[1, N] via Expression 9 and then calculates Expression 10. In this way, the LDPC decoder 1500 calculates a tentative estimated codeword $(c'_1, \ldots, c'_N)$.

[Math 9]

$$\Lambda_n = \lambda_n + \sum_{m \in B(n)} \alpha_{m,n} \qquad \text{Expression 9}$$

[Math 10]

$$c'_n = \begin{cases} 0, & \text{if } sign(\Lambda_n) = 1 \\ 1, & \text{if } sign(\Lambda_n) = -1 \end{cases} \qquad \text{Expression 10}$$

Step 5 (Parity Check)

The LDPC decoder 1500 checks whether the tentative estimated codeword $(c'_1, c'_N)$ is a codeword. In other words, the LDPC decoder 1500 determines whether the tentative estimated codeword $(c'_1, c'_N)$ satisfies Expression 11.

[Math 11]

$$H(c'_1, \ldots, c'_N)^T = 0 \qquad \text{Expression 11}$$

If the tentative estimated codeword $(c'_1, \ldots, c'_N)$ satisfies Expression 11, the tentative estimated codeword $(c'_1, \ldots, c'_N)$ is a codeword, and therefore the LDPC decoder 1500 outputs the tentative estimated codeword $(c'_1, \ldots, c'_N)$ as an estimated codeword, thus completing the algorithm.

Step 6 (Count of Iterations)

If the tentative estimated codeword $(c'_1, \ldots, c'_N)$ does not satisfy Expression 11, then when q<Q, the value of q is incremented and processing returns to step 2. If q=Q, the LDPC decoder 1500 outputs the tentative estimated word $(c'_1, \ldots, c'_N)$ as an estimated codeword, thus completing the algorithm.

The LDPC decoder 1500 outputs the estimated codeword $(c'_1, \ldots, c'N)$ obtained by performing the decoding algorithm of the above steps 1-6. When the LDPC encoder 1100 performs systematic encoding, $(b'_1, \ldots, b'_N) = (c'_1, \ldots, c'_N)$ are obtained as the received information bits $(b'_1, \ldots, b'_N)$.

The main calculations in the above-described sum-product decoding are addition in the variable nodes and calculation of tan h/tan h$^{-1}$ in the check nodes. Since the cost of calculating tan h/tan h$^{-1}$ is high as compared to addition, decreasing the cost for such calculation upon implementation leads to increased speed of decoding and to increased compactness. One method for increasing speed and compactness is to approximate the calculation of tan h/tan h$^{-1}$ during sum-product decoding with a minimum value. This method is called min-sum decoding. Instead of Expression 8, Expression 12 is used in the check nodes.

[Math 12]

$$\alpha_{m,n} = \left( \prod_{n' \in A(m)\backslash n} \text{sign}(\beta_{m,n'}) \right) \min_{n' \in A(m)\backslash n} |\beta_{m,n'}| \qquad \text{Expression 12}$$

Furthermore, instead of Expression 6, Expression 13 is used in the variable nodes.

[Math 13]

$$\beta_{m,n} = w \times \left( \lambda_n + \sum_{m' \in B(n)\backslash m} \alpha_{m',n} \right) \qquad \text{Expression 13}$$

In this expression, w is a positive real number equal to or less than one. In the case of (3, 6) regular LDPC codes, it has been confirmed that if a value of approximately 0.8 is provided for w, error ratio characteristics equivalent to sum-product decoding are obtained. However, the optimal value for w changes depending on the parity check matrix H.

In order to remove the influence of external noise, the case of inputting an LLR of 0 into the decoder for bits assumed to have been influenced by external noise, as described above, is considered. The following description refers to an LLR of 0 as "elimination". Similarly, setting the LLR to 0 is referred to as "eliminating", and a bit whose LLR is set to 0 is referred to as an "eliminated bit".

With reference to FIG. 4, an example in which the bits corresponding to variable nodes for n=1, 5 are eliminated bits is described. The LLR input into the variable nodes of the LDPC decoder 1500 is transmitted as is at the start of decoding to a plurality of connected check nodes as the a priori value $\beta_{m,n}$. In this case, when considering the processing at check node 3 shown in FIG. 4, six a priori values $\beta_{3,1}, \beta_{3,3}, \beta_{3,5}, \beta_{3,7}, \beta_{3,9}$, and $\beta_{3,10}$, are input into the check node 3. Among these values, the a priori value $\beta_{3,1}$ and the a priori value $\beta_{3,5}$ are zero. Since the check node calculation shown in Expression 8 is multiplication of the value yielded by tan h of $\beta_{m,n}'$ as input into the check node, the resulting $\alpha_{m,n}$ are all zero if the a priori values $\beta_{m,n}$ input into the check node include two or more values of zero.

tan $h(0)$=tan $h^{-1}(0)$=0

Therefore, during calculation at the check node for m=3, the extrinsic value is not updated, and as a result, the benefit of iterative decoding is reduced. Furthermore, a similar phenomenon occurs when adopting Expression 12, which uses a minimum value search, instead of tan h/tan h$^{-1}$. Since a minimum value of the absolute value of $\beta_{m,n}$, is returned as the extrinsic values $\alpha_{m,n}$, the resulting $\alpha_{m,n}$ are all zero if $\beta_{m,n}$ include two or more values of zero.

In subsequent iterations, if the a priori values $\beta_{3,1}$ and $\beta_{3,5}$ are updated to take on values other than zero during processing of the variable nodes for n=1 and 5, the above local problem is resolved. However, other problems remain, such as an increase in the number of iterations necessary to acquire the desired bit error ratio, as well as a problem related to decoding performance in that the bit rate achievable by performing a predetermined number of iterations degrades.

Furthermore, in the worst case scenario, if elimination occurs wherein the extrinsic value output from all of the check nodes is zero, the extrinsic value is not updated, and decoding performance drastically degrades. For example, this phenomenon occurs upon elimination of all of the bits included in a set of codeword bits referred to as a "stopping set" as defined in Non-Patent Literature 3. Decoding performance degrades even when only a plurality of bits that form part of a stopping set are eliminated, albeit not to the same degree as when all bits are eliminated.

The following describes an example using calculator simulation results. FIG. 5 is a graph showing results of a simulation (case (a)) of bit error ratio characteristics after decoding when eliminating the second, fourth, and eighth bits in the parity check matrix in Expression 1 and results of a simulation (case (b)) of bit error ratio characteristics after decoding when eliminating the fourth, fifth, and seventh bits in the parity check matrix in Expression 1. In this case, the combination of the second, fourth, and eight eliminated bits in case (a) is a stopping set for the parity check matrix H, whereas the combination of the fourth, fifth, and seventh eliminated bits in case (b) is not a stopping set for the parity check matrix H. The decoding method used in the simulation is min-sum decoding letting the maximum number of iterations be 30 and w be 0.8. Since the eliminated bits form a stopping set in case (a), the bit error ratio does not improve, even by setting Eb/N0 high. On the other hand, since the eliminated bits do not form a stopping set in case (b), the bit error ratio improves in response to magnification of Eb/N0.

As confirmed by the above simulation, in an environment with external noise, a conventional structure that avoids the influence of external noise by decoding after eliminating bits that are influenced by external noise has the problem that, even when the number of eliminated bits is the same, decoding performance drastically degrades depending on the combination of eliminated bits.

Patent Literature 1 and Patent Literature 2 disclose conventional means for improving performance taking into consideration an error correction code in an environment with external noise.

Patent Literature 1 discloses counting the number of occurrences of impulse noise before signal transmission and changing the number of transmissions of the signal in accordance with the number of occurrences of impulse noise. In this method, changing the number of transmissions corresponds to changing the number of repetitions (code rate) of repetitive encoding. Use of this method increases the likelihood of successful transmission even when a large amount of impulse noise Occurs.

On the other hand, Patent Literature 2 discloses controlling the periodic occurrence of impulse noise and the block length of a Reed-Solomon code so that the number of impulses in periodic impulse noise included in a block of a Reed-Solomon code is within the correctable number of errors of the Reed-Solomon code. Use of this method avoids the occurrence of a greater number of errors than is correctable within the block length of the Reed-Solomon code, thereby efficiently achieving the advantageous effect of error correction.

Neither of these two methods, however, solves the problem of degrading of decoding performance due to combinations of eliminations at the bit level.

To address these problems, it is an object of the present invention to provide a transmission device, a reception device, a transmission method, and a reception method that suppress the degrading of decoding performance due to combinations of eliminations at the bit level.

Solution to Problem

In order to solve the above problems, a transmission device according to the present invention comprises a determining unit operable to determine an LDPC encoding method for use in transmission to be an LDPC encoding method corresponding to occurrence conditions of external noise from a plurality of LDPC encoding methods, each having the same code length and the same code rate and being defined by a different parity check matrix; and an encoding unit operable to generate a codeword bit sequence by encoding transmission data using the LDPC encoding method determined by the determining unit.

Advantageous Effects of Invention

With this structure, if decoding performance by a reception device degrades due to use of an LDPC encoding method for which combinations of codeword bits are eliminated due to the influence of external noise, the LDPC encoding method used to encode transmission data is changed to a different LDPC encoding method. Therefore, decoding performance by the reception device can be improved without changing the code length or the code rate.

BRIEF DESCRIPTION OF DRAWINGS

FIG. 19 shows the noise level estimated by the noise occurrence conditions estimation unit 20 in FIG. 18.

DESCRIPTION OF EMBODIMENTS

Figure 1:
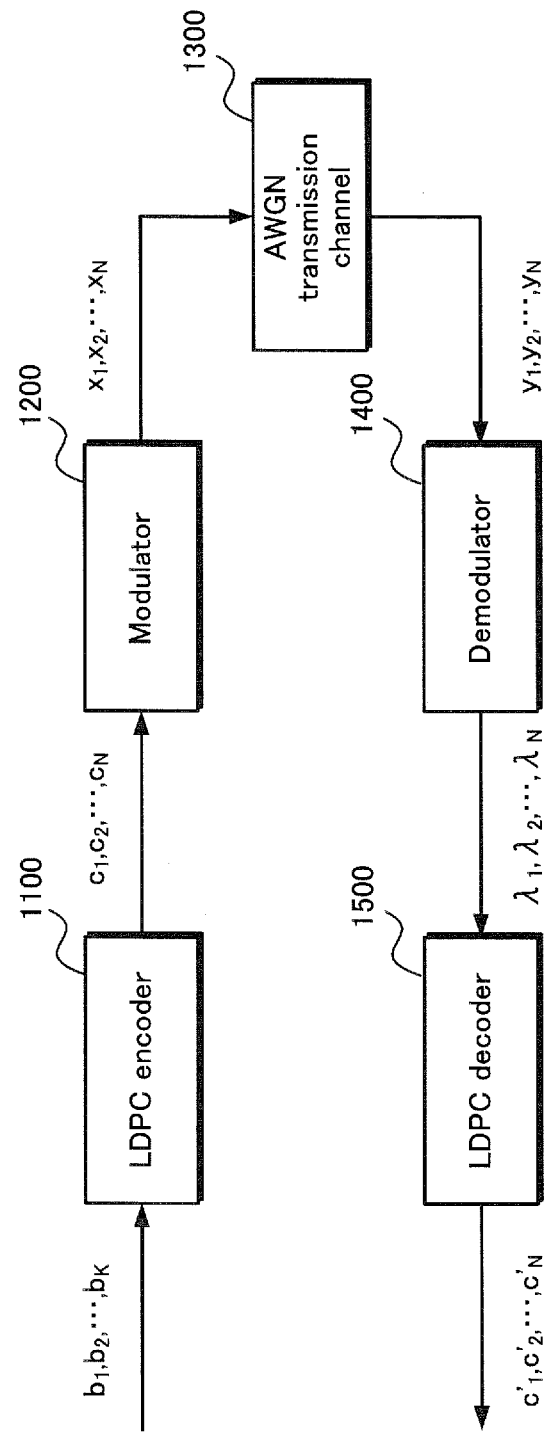
FIG. 1 shows a model of encoding and decoding for an AWGN channel.
Figure 2:
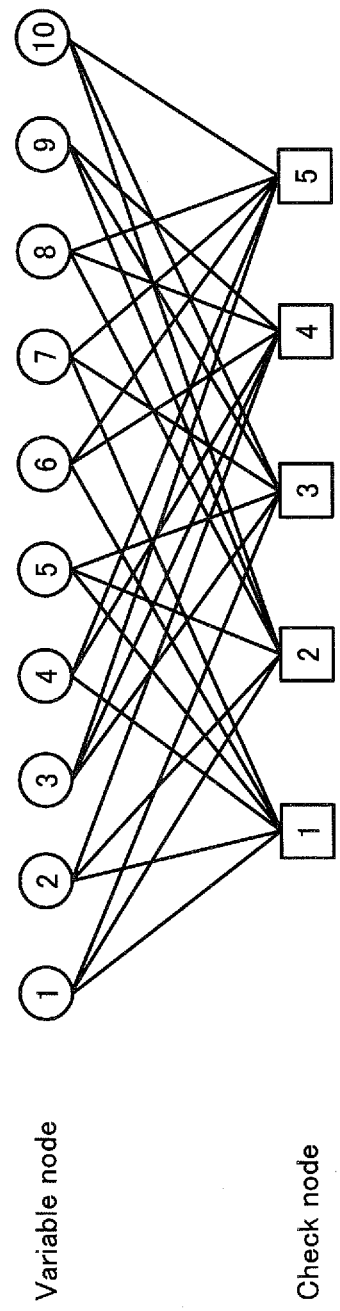
FIG. 2 shows a Tanner graph corresponding to a parity check matrix H.
Figure 3:
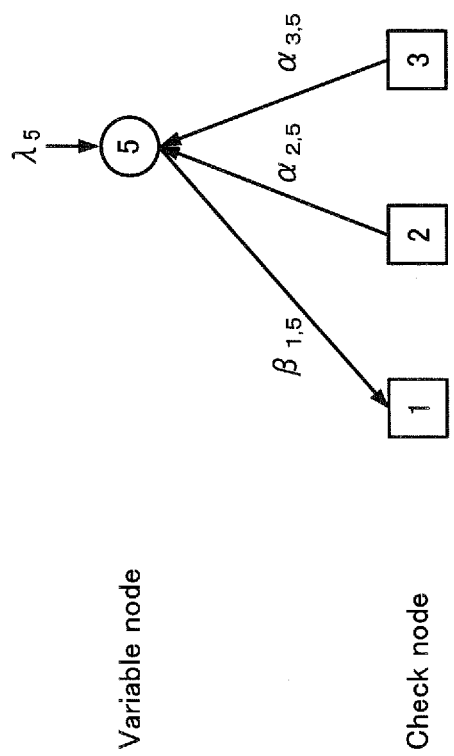
FIG. 3 shows an example of variable node processing in the Tanner graph.
Figure 4:
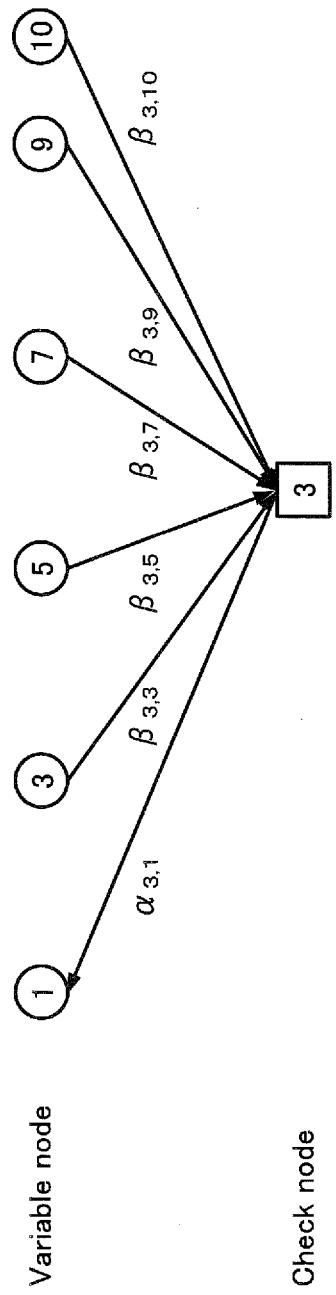
FIG. 4 shows an example of check node processing in the Tanner graph.

A first transmission device, which is an aspect of the present invention, comprises a determining unit operable to determine an LDPC encoding method for use in transmission to be an LDPC encoding method corresponding to occurrence conditions of external noise from a plurality of LDPC encoding methods, each having the same code length and the same code rate and being defined by a different parity check matrix; and an encoding unit operable to generate a codeword bit sequence by encoding transmission data using the LDPC encoding method determined by the determining unit.

A first reception device, which is an aspect of the present invention, comprises a reception unit operable to receive a signal transmitting a codeword bit sequence generated by encoding transmission data using an LDPC encoding method corresponding to occurrence conditions of external noise among a plurality of LDPC encoding methods each having the same code length and the same code rate and being defined by a different parity check matrix; a demodulation unit operable to demodulate the signal received by the reception unit in order to generate a received codeword bit sequence corresponding to the codeword bit sequence of the received signal; and a decoding unit operable to decode the received codeword bit sequence in accordance with the LDPC encoding method used to code the transmission data.

A first transmission method, which is an aspect of the present invention, comprises the steps of (a) determining an LDPC encoding method for use in transmission to be an LDPC encoding method corresponding to occurrence conditions of external noise from a plurality of LDPC encoding methods, each having the same code length and the same code rate and being defined by a different parity check matrix; and (b) generating a codeword bit sequence by encoding transmission data using the LDPC encoding method determined in step (a).

A first reception method, which is an aspect of the present invention, comprises the steps of (a) receiving a signal transmitting a codeword bit sequence generated by encoding transmission data using an LDPC encoding method corresponding to occurrence conditions of external noise among a plurality of LDPC encoding methods each having the same code length and the same code rate and being defined by a different parity check matrix; (b) demodulating the signal received in step (a) in order to generate a received codeword bit sequence corresponding to the codeword bit sequence of the received signal; and (c) decoding the received codeword bit sequence in accordance with the LDPC encoding method used to code the transmission data.

With the first transmission device, the first reception device, the first transmission method, and the first reception method, if decoding performance by a reception device degrades due to use of an LDPC encoding method for which combinations of codeword bits are eliminated due to the influence of external noise, the LDPC encoding method used to encode transmission data is changed to a different LDPC encoding method. Therefore, decoding performance by the reception device can be improved without changing the code length or the code rate.

A second transmission device, which is an aspect of the present invention, is the first transmission device wherein the plurality of LDPC encoding methods includes at least a first LDPC encoding method defined by a first parity check matrix and a second LDPC encoding method defined by a second parity check matrix, and a combination of a predetermined number of codeword bits forms a stopping set for the first parity check matrix and does not form a stopping set for the second parity check matrix.

With the second transmission device, even if a combination of codeword bits eliminated due to the influence of external noise forms a stopping set for the first parity check matrix, decoding performance by a reception device can be improved by using the second LDPC encoding method defined by the second parity check matrix for which the combination does not form a stopping set.

A third transmission device, which is an aspect of the present invention, is the second transmission device further comprising an elimination pattern estimation unit operable to estimate an elimination pattern in accordance with occurrence conditions of external noise, the elimination pattern indicating a count of candidate elimination bits and a position within a codeword of each candidate elimination bit, a candidate elimination bit being one of a plurality of codeword bits forming a codeword bit sequence and having a high probability of being eliminated by a reception device before decoding, wherein the determining unit determines the LDPC encoding method for use in transmission from the plurality of LDPC encoding methods in accordance with an estimation of decoding performance for each parity check matrix, the estimation being in accordance with a relationship between the elimination pattern estimated by the elimination pattern estimation unit and the parity check matrix.

With the third transmission device, transmission data is encoded using an LDPC encoding method defined by a parity check matrix for which decoding performance is good for the elimination pattern estimated based on the occurrence conditions of external noise.

A fourth transmission device, which is an aspect of the present invention, is the third transmission device wherein the determining unit determines the LDPC encoding method for use in transmission to be an LDPC encoding method defined by a parity check matrix for which a combination of positions within a codeword of the candidate elimination bits indicated by the elimination pattern does not form a stopping set.

With the fourth transmission device, transmission data is encoded using an LDPC encoding method defined by a parity check matrix that has good decoding performance, and does not form a stopping set, for a combination of positions within the codeword of candidate elimination bits.

A fifth transmission device, which is an aspect of the present invention, is the fourth transmission device wherein in the parity check matrix for which a combination of positions within a codeword of the candidate elimination bits indicated by the elimination pattern does not form a stopping set, at least one row has a row weight of one in a partial matrix formed by extracting, from the parity check matrix, columns corresponding to positions within a codeword of the candidate elimination bits indicated by the elimination pattern.

A sixth transmission device, which is an aspect of the present invention, is the third transmission device wherein the determining unit determines the LDPC encoding method for use in transmission to be an LDPC encoding method defined by a parity check matrix, among a plurality of parity check matrices for which a combination of positions within a codeword of the candidate elimination bits indicated by the elimination pattern does not form a stopping set, in which a largest number of rows have a row weight of 0 or 1 in a partial matrix formed by extracting, from the parity check matrix, columns corresponding to positions within a codeword of the candidate elimination bits indicated by the elimination pattern.

With the sixth transmission device, transmission data is encoded using an LDPC encoding method defined by a parity check matrix that has the best decoding performance among parity check matrices that have good decoding performance, and do not form a stopping set, for a combination of positions within the codeword of candidate elimination bits.

A seventh transmission device, which is an aspect of the present invention, is the third transmission device wherein the determining unit determines the LDPC encoding method for use in transmission to be an LDPC encoding method defined by a parity check matrix, among a plurality of parity check matrices for which a combination of positions within a codeword of the candidate elimination bits indicated by the elimination pattern does not form a stopping set, in which a maximum value of row weighting is smallest in a partial matrix formed by extracting, from the parity check matrix, columns corresponding to positions within a codeword of the candidate elimination bits indicated by the elimination pattern.

With the seventh transmission device, transmission data is encoded using an LDPC encoding method defined by a parity check matrix that has the best decoding performance among parity check matrices that have good decoding performance, and do not form a stopping set, for a combination of positions within the codeword of candidate elimination bits.

An eighth transmission device, which is an aspect of the present invention, is the third transmission device further comprising a noise occurrence conditions estimation unit operable to estimate occurrence conditions of external noise in accordance with a signal received from a transmission channel, wherein the elimination pattern estimation unit estimates the elimination pattern in accordance with the occurrence conditions of external noise estimated by the noise occurrence conditions estimation unit.

The eighth transmission device determines, by itself, an LDPC encoding method corresponding to occurrence conditions of external noise at the transmission device to be the LDPC encoding method used to encode transmission data without obtaining occurrence conditions of external noise from another device.

A ninth transmission device, which is an aspect of the present invention, is the first transmission device further comprising a reception unit operable to receive a signal that includes an elimination pattern indicating a position within a codeword of each codeword bit, among codeword bits forming a codeword bit sequence, that is eliminated by a reception device before decoding, wherein the determination unit determines the LDPC encoding method for use in transmission from the plurality of LDPC encoding methods in accordance with an estimation of decoding performance for each LDPC encoding method, the estimation being in accordance with a relationship between the elimination pattern received by the reception unit and the parity check matrix for each LDPC encoding method.

Even in a communications environment in which an elimination pattern, which indicates a position within a codeword of each candidate elimination bit, as estimated from occurrence conditions of external noise observed by the transmission device differs from an elimination pattern indicating a position within a codeword of each bit eliminated at the receiving end, the ninth transmission device allows for encoding of transmission data with an LDPC encoding method that has good decoding performance in the reception device.

A tenth transmission device, which is an aspect of the present invention, is the first transmission device further comprising a reception unit operable to receive a signal that indicates an LDPC encoding method determined by a reception device in accordance with a relationship between an elimination pattern and the parity check matrix defining the LDPC encoding method, the elimination pattern indicating a position within a codeword of each codeword bit, among codeword bits forming a codeword bit sequence, that is eliminated by the reception device before decoding, wherein the determining unit determines the LDPC encoding method for use in transmission in accordance with received signal that indicates the LDPC encoding method.

Even in a communications environment in which an elimination pattern, which indicates a position within a codeword of each candidate elimination bit, as estimated from occurrence conditions of external noise observed by the transmission device differs from an elimination pattern indicating a position within a codeword of each bit eliminated at the receiving end, the tenth transmission device allows for encoding of transmission data with an LDPC encoding method that has good decoding performance in the reception device.

An eleventh transmission device, which is an aspect of the present invention, is the first transmission device wherein the plurality of LDPC encoding methods includes at least a first LDPC encoding method defined by a first parity check matrix and a second LDPC encoding method defined by a second parity check matrix, and the second parity check matrix is any of a plurality of parity check matrices yielded by exchanging rows of the first parity check matrix.

A twelfth transmission device, which is an aspect of the present invention, is the first transmission device wherein the plurality of LDPC encoding methods includes at least a first LDPC encoding method defined by a first parity check matrix and a second LDPC encoding method defined by a second parity check matrix, and the second parity check matrix is an independent matrix with respect to the first parity check matrix.

A thirteenth transmission device, which is an aspect of the present invention, is the first transmission device further comprising a modulation unit operable to generate a modulated signal by modulating the codeword bit sequence generated by the encoding unit; and a transmission unit operable to transmit the modulated signal along with information indicating the LDPC encoding method used by the encoding unit to code the transmission data.

The thirteenth transmission device enables the reception device to perform decoding based on the LDPC encoding method used for encoding of transmission data by the transmission device.

A fourteenth transmission device, which is an aspect of the present invention, comprises a determining unit operable to determine, from a plurality of exchange rules for exchanging codeword bits within a codeword, an exchange rule corresponding to occurrence conditions of external noise; and an encoding unit operable to generate a first codeword bit sequence by encoding transmission data using an LDPC encoding method and to generate a second codeword bit sequence by exchanging codeword bits within a codeword of the first codeword bit sequence in accordance with the exchanging rule determined by the determining unit.

A second reception device, which is an aspect of the present invention, comprises a reception unit operable to receive a signal transmitting a second codeword bit sequence, the second codeword bit sequence being generated by exchanging codeword bits within a codeword of a first codeword bit sequence in accordance with an exchange rule, among a plurality of exchange rules for exchanging codeword bits within a codeword, that corresponds to occurrence conditions of external noise, the first codeword bit sequence being generated by encoding transmission data using an LDPC encoding method; a demodulation unit operable to demodulate the signal received by the reception unit in order to generate a second received codeword bit sequence corresponding to the second codeword bit sequence; and a decoding unit operable to generate a first received codeword bit sequence by replacing bits of the second received codeword bit sequence in accordance with an exchange rule opposite to the exchange rule used to exchange codeword bits of the first codeword bit sequence and to decode the first received codeword bit sequence in accordance with the LDPC encoding method.

A second transmission method, which is an aspect of the present invention, comprises the steps of (a) determining, from a plurality of exchange rules for exchanging codeword bits within a codeword, an exchange rule corresponding to occurrence conditions of external noise; and (b) generating a first codeword bit sequence by encoding transmission data using an LDPC encoding method and generating a second codeword bit sequence by exchanging codeword bits within a codeword of the first codeword bit sequence in accordance with the exchanging rule determined in step (a).

A second reception method, which is an aspect of the present invention, comprises the steps of: (a) receiving a signal transmitting a second codeword bit sequence, the second codeword bit sequence being generated by exchanging codeword bits within a codeword of a first codeword bit sequence in accordance with an exchange rule, among a plurality of exchange rules for exchanging codeword bits within a codeword, that corresponds to occurrence conditions of external noise, the first codeword bit sequence being generated by encoding transmission data using an LDPC encoding method; (b) demodulating the signal received in step (a) in order to generate a second received codeword bit sequence corresponding to the second codeword bit sequence; and (c) generating a first received codeword bit sequence by replacing bits of the second received codeword bit sequence in accordance with an exchange rule opposite to the exchange rule used to exchange codeword bits of the first codeword bit sequence and decoding the first received codeword bit sequence in accordance with the LDPC encoding method.

With the fourteenth transmission device, the second reception device, the second transmission method, and the second reception method, if decoding performance by a reception device degrades due to use of an exchange rule for exchanging codeword bits within a codeword and for which combinations of codeword bits are eliminated due to the influence of external noise, the exchange rule that is used is changed to a different exchange rule. Therefore, decoding performance by the reception device can be improved without changing the LDPC encoding method.

A fifteenth transmission device, which is an aspect of the present invention, comprises a determining unit operable to determine, for use in transmission, an interleaving pattern corresponding to occurrence conditions of external noise from a plurality of interleaving patterns for a codeword bit sequence; an encoding unit operable to generate a codeword bit sequence by encoding transmission data using an LDPC encoding method; and an interleaving unit operable to generate a transmission bit sequence by interleaving the codeword bit sequence generated by the encoding unit in accordance with the interleaving pattern determined by the determining unit.

A third reception device, which is an aspect of the present invention, comprises a reception unit operable to receive a signal transmitting a transmission bit sequence generated by interleaving a codeword bit sequence with an interleaving pattern, among a plurality of interleaving patterns, that corresponds to occurrence conditions of external noise, the codeword bit sequence being generated by encoding transmission data using an LDPC encoding method; a demodulation unit operable to demodulate the signal received by the reception unit in order to generate a received bit sequence corresponding to the transmission bit sequence of the received signal; a deinterleaving unit operable to generate a received codeword bit sequence by deinterleaving the received bit sequence with a deinterleaving pattern opposite to the interleaving pattern used to interleave the codeword bit sequence; and a decoding unit operable to decode the received codeword bit sequence in accordance with the LDPC encoding method.

A third transmission method, which is an aspect of the present invention, comprises the steps of (a) determining, for use in transmission, an interleaving pattern corresponding to occurrence conditions of external noise from a plurality of interleaving patterns for a codeword bit sequence; (b) generating a codeword bit sequence by encoding transmission data using an LDPC encoding method; and (c) generating a transmission bit sequence by interleaving the codeword bit sequence generated in step (b) in accordance with the interleaving pattern determined in step (a).

A third reception method, which is an aspect of the present invention, comprises the steps of: (a) receiving a signal transmitting a transmission bit sequence generated by interleaving a codeword bit sequence with an interleaving pattern, among a plurality of interleaving patterns, that corresponds to occurrence conditions of external noise, the codeword bit sequence being generated by encoding transmission data using an LDPC encoding method; (b) demodulating the signal received in step (a) in order to generate a received bit sequence corresponding to the transmission bit sequence of the received signal; (c) generating a received codeword bit sequence by deinterleaving the received bit sequence with a deinterleaving pattern opposite to the interleaving pattern used to interleave the codeword bit sequence; and (d) decoding the received codeword bit sequence in accordance with the LDPC encoding method.

With the fifteenth transmission device, the third reception device, the third transmission method, and the third reception method, if decoding performance by a reception device degrades due to use of an interleaving pattern for which combinations of codeword bits are eliminated due to the influence of external noise, the interleaving pattern that is used is changed to a different interleaving pattern. Therefore, decoding performance by the reception device can be improved without changing the LDPC encoding method.

A sixteenth transmission device, which is an aspect of the present invention, comprises a determining unit operable to estimate, in accordance with occurrence conditions of external noise, subcarriers that transmit candidate elimination bits from a plurality of subcarriers used for transmission, a candidate elimination bit being one of a plurality of codeword bits forming a codeword bit sequence generated by encoding and having a high probability of being eliminated by a reception device before decoding, and to determine, for use in transmission, a tone map indicating a modulation method with a low modulation level, among a plurality of modulation methods, as a modulation method for use in at least one of the estimated subcarriers; an encoding unit operable to generate a codeword bit sequence by encoding transmission data using an LDPC encoding method; and a modulation unit operable to generate a modulated signal by modulating, in accordance with the tone map determined by the determining unit, the codeword bit sequence generated by the encoding unit.

A fourth transmission method, which is an aspect of the present invention, comprises the steps of: (a) estimating, in accordance with occurrence conditions of external noise, subcarriers that transmit candidate elimination bits from a plurality of subcarriers used for transmission, a candidate elimination bit being one of a plurality of codeword bits forming a codeword bit sequence generated by encoding and having a high probability of being eliminated by a reception device before decoding, and determining, for use in transmission, a tone map indicating a modulation method with a low modulation level, among a plurality of modulation methods, as a modulation method for use in at least one of the estimated subcarriers; (b) generating a codeword bit sequence by encoding transmission data using an LDPC encoding method; and (c) generating a modulated signal by modulating, in accordance with the tone map determined in step (a), the codeword bit sequence generated in step (b).

The sixteenth transmission device and the fourth transmission method allow for reduction of the number of codeword bits that are eliminated by the influence of external noise, thereby allowing for improvement of decoding performance by the reception device without changing the LDPC encoding method.

The following describes embodiments of the present invention with reference to the drawings.

Embodiment 1

The following describes Embodiment 1 with reference to the drawings.

The communications device at the transmitting end in Embodiment 1 observes the occurrence conditions of external noise in the channel and, based on the observed occurrence conditions of external noise, estimates candidate elimination bits that have a high probability of being eliminated before decoding by the communications device at the receiving end. Subsequently, the communications device at the transmitting end in Embodiment 1 estimates the decoding performance that will be obtained by the communications device at the receiving end if transmission data is encoded using a parity check matrix, based on the relationship between the parity check matrix and the position within the codeword of the estimated candidate elimination bits (hereinafter referred to as "decoding performance when using the parity check matrix" for the sake of convenience). Based on the results of estimation, the communications device at the transmitting end then determines a parity check matrix that achieves a predetermined decoding performance and performs LDPC encoding of the transmission data using the determined parity check matrix. The communications device at the transmitting end determines the parity check matrix used for LDPC encoding of the transmission data from a plurality of parity check matrices having the same number of rows as each other and the same number of columns as each other. In other words, the communications device at the transmitting end determines an LDPC encoding method defined by a parity check matrix used for encoding of transmission data from a plurality of LDPC encoding methods defined by different parity check matrices having the same code length and the same code rate.

Note that candidate elimination bits are described as having a high probability of being eliminated by the communications device at the receiving end out of consideration for the possibility of elimination by the communications device at the receiving end of bits other than the bits determined by the communications device at the transmitting end to be candidate elimination bits due to the influence of external noise that did not occur during observation of occurrence conditions of external noise, as well as the possibility of bits determined to be candidate elimination bits not being eliminated by the communications device at the receiving end due to reception conditions. The criteria for determining the strength and frequency of external noise when determining, based on the occurrence conditions of external noise in the channel, whether a bit influenced by external noise is a candidate elimination bit may be set beforehand in accordance with the type of external noise, the number of candidate elimination bits, or the like assumed to occur in the communications system of Embodiment 1 or in other embodiments and modifications to the communications system. Alternatively, the criteria may be selected from a plurality of sets of criteria in accordance with reception conditions.

Figure 6:
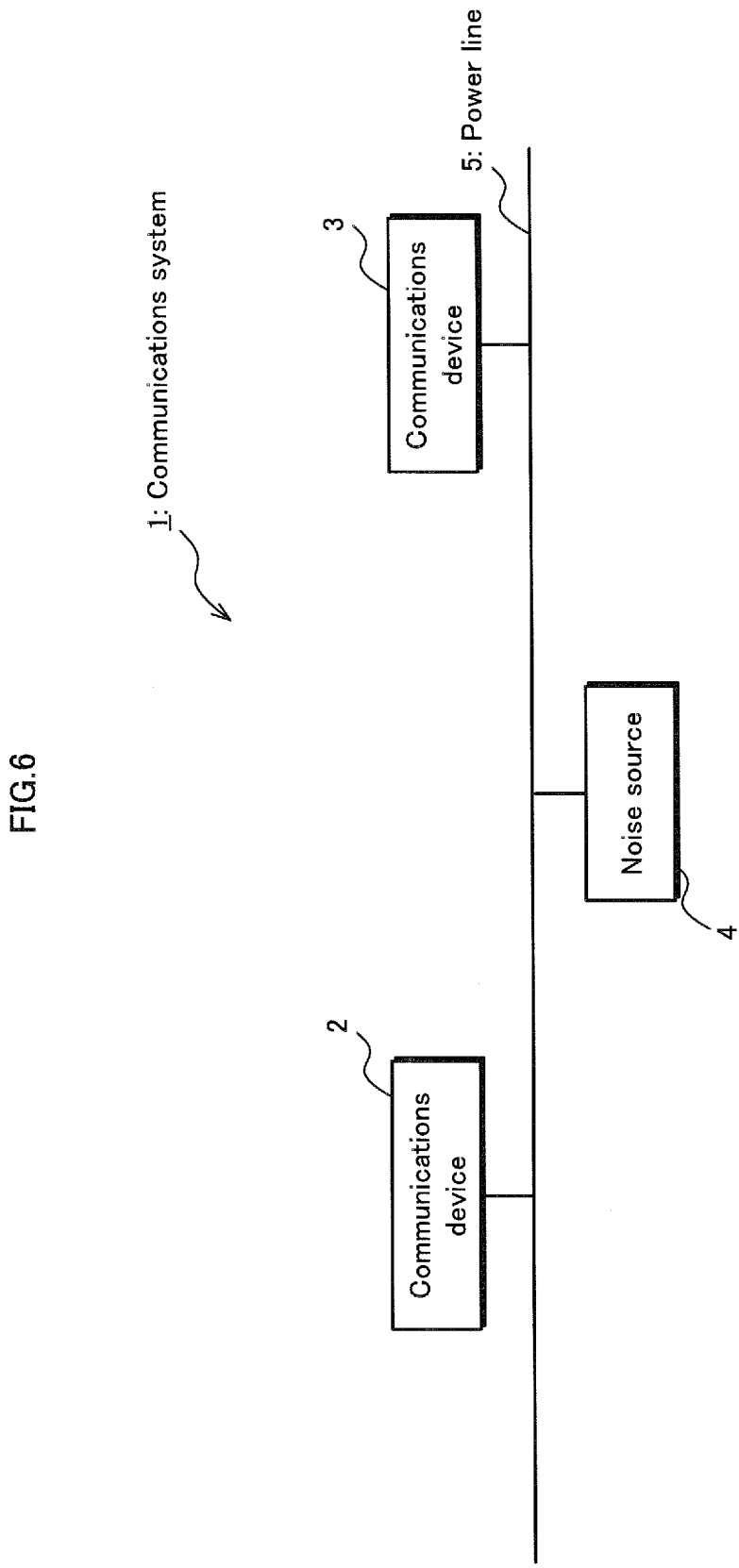
FIG. 6 shows an example of the structure of a communications system 1 in Embodiment 1 of the present invention.

FIG. 6 shows an example of the structure of a communications system in Embodiment 1. The communications system 1 in FIG. 6 is a PLC system in which a plurality of transmission devices are connected to the same power line network and perform PLC with each other.

The communications system 1 includes a communications device 2, a communications device 3, and a noise source 4. The communications device 2 and the communications device 3 are connected to a power line 5. The communications device 2 and the communications device 3 perform PLC with each other.

The communications device 2 observes the occurrence conditions of external noise in the channel and, based on the observed occurrence of external noise, estimates candidate elimination bits that have a high probability of being eliminated before decoding by the communications device at the receiving end. Then, while changing the parity check matrix, the communications device 2 estimates the decoding performance when using the parity check matrix, based on the relationship between the parity check matrix and the position within the codeword of the estimated candidate elimination bits. Based on the results of estimation, the communications device 2 then determines a parity check matrix that achieves a predetermined decoding performance and performs LDPC encoding of the transmission data using the determined parity check matrix. The communications device 2 determines the parity check matrix used for LDPC encoding of the transmission data from a plurality of parity check matrices having the same number of rows as each other and the same number of columns as each other.

Note that the communications device 2 is one embodiment of a transmission device that determines an LDPC encoding method that corresponds to the occurrence conditions of external noise from a plurality of LDPC encoding methods defined by different parity check matrices having the same code length and the same code rate, uses the determined LDPC encoding method to encode the transmission data, and thus generates a codeword bit sequence.

When receiving a signal in an environment with external noise, the communications device 3 eliminates bits estimated to have been influenced by external noise and performs LDPC decoding based on the parity check matrix used by the communications device 2 for LDPC encoding of the transmission data.

The noise source 4 is an electrical appliance that produces external noise and is connected to the same power line 5 as the communications device 2 and the communications device 3.

Figure 7:
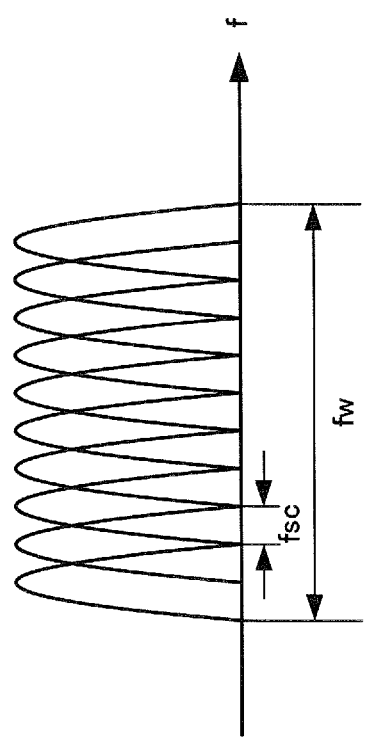
FIG. 7 shows a frequency spectrum for a signal transmitted from the communications device 2 in FIG. 6.

FIG. 7 shows a frequency spectrum for a signal transmitted from the communications device 2 in FIG. 6. As a transmission signal, the communications device 2 uses a multicarrier modulated signal with aggregate bandwidth fw (Hz) and a subcarrier interval fsc (Hz). Multicarrier modulated signals include Orthogonal Frequency Division Multiplexing (OFDM) that uses an inverse discrete Fourier transform for multicarrier modulation and Wavelet-OFDM that uses an inverse discrete wavelet transform, yet any form of multicarrier modulation may be adopted. Note that the same is true for other embodiments and modifications that use a multicarrier modulated signal.

Figure 8:
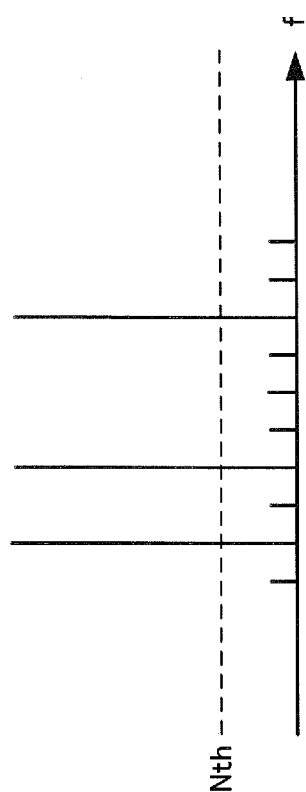
FIG. 8 shows an example of a noise spectrum produced by the noise source 4 in FIG. 6.

FIG. 8 shows an example of a noise spectrum produced by the noise source 4 in FIG. 6. Note that FIG. 8 only shows the noise power level in the central frequency of each subcarrier of the multicarrier modulated signal shown in FIG. 7.

Figure 9:
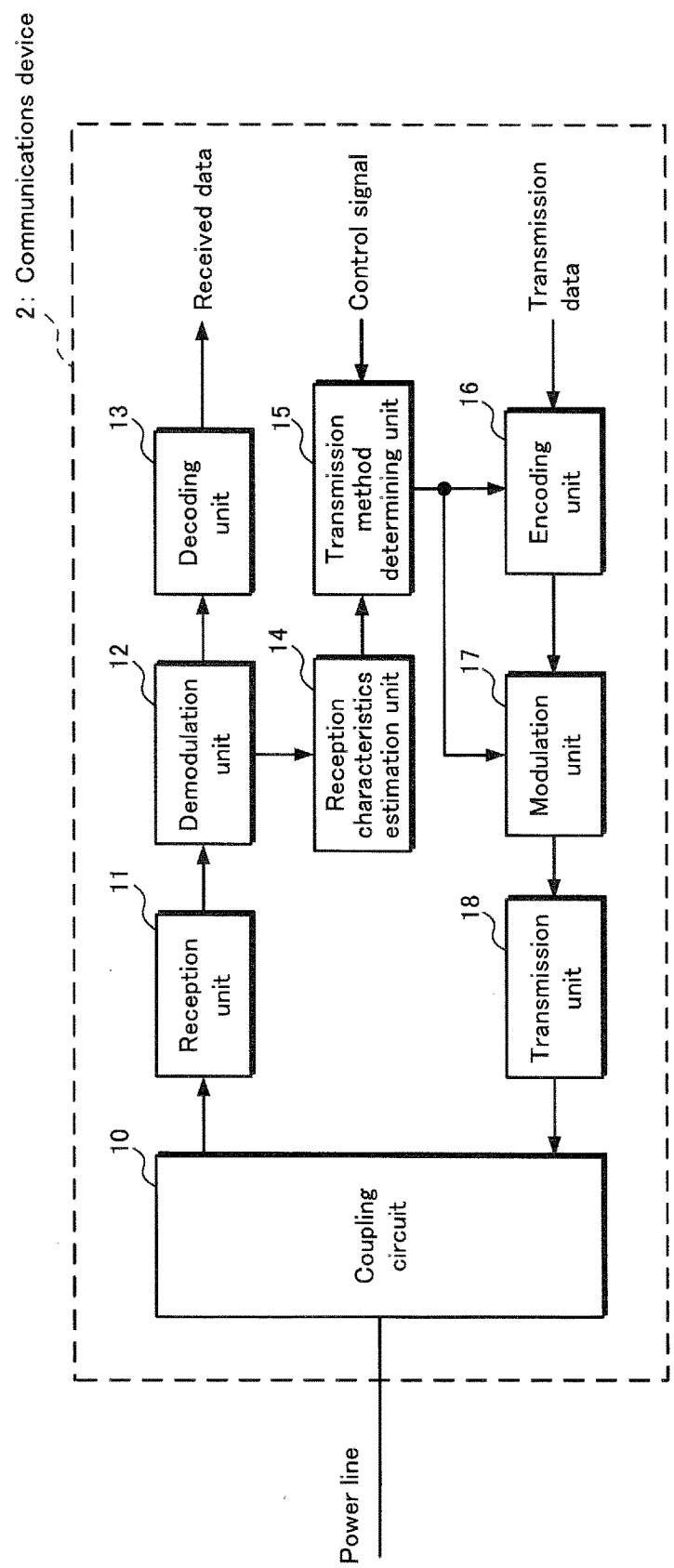
FIG. 9 shows the structure of the communications device 2 in FIG. 6.

FIG. 9 shows the structure of the communications device 2 in FIG. 6. The communications device 2 is provided with a coupling circuit 10, a reception unit 11, a demodulation unit 12, a decoding unit 13, a reception characteristics estimation unit 14, a transmission method determining unit 15, a encoding unit 16, a modulation unit 17, and a transmission unit 18.

The coupling circuit 10 extracts a transmission signal impressed on the power line that serves as the channel and outputs the transmission signal to the reception unit 11. The coupling circuit 10 also impresses a transmission signal received from the transmission unit 18 onto the power line that serves as the channel.

The reception unit 11 performs reception processing on the signal (the transmission signal extracted by the coupling circuit 10) transmitted over the power line that serves as the channel, such as carrier extraction, filtering, frequency conversion, synchronization, A/D conversion, and the like.

Note that when there is no signal with carriers transmitted over the power line by another communications device, the coupling circuit 10 and the reception unit 11 process the noise on the power line, and the reception unit 11 outputs a signal related to noise to the demodulation unit 12.

The demodulation unit 12 performs multicarrier demodulation on the signal received from the reception unit 11. The demodulation unit 12 demodulates each subcarrier in accordance with a tone map indicated by the modulation method for each subcarrier of the multicarrier modulated signal as used by the communications device that transmitted the received signal and calculates the LLR of each transmitted codeword bit. In this case, as described above, the demodulation unit 12 eliminates codeword bits by setting the LLR to zero for bits determined to have been strongly influenced by external noise. The demodulation unit 12 outputs an LLR sequence to the decoding unit 13. Note that the demodulation unit 12 determines that a bit has been influenced by powerful external noise if the LLR is larger than a predetermined threshold, for example. Furthermore, the demodulation unit 12 performs multicarrier demodulation on the signal output by the reception unit 11 in case there is no signal with carriers transmitted by another communications device. The demodulation unit 12 outputs the signal obtained as a result of multicarrier demodulation to the reception characteristics estimation unit 14 as a signal for estimation of noise conditions.

Using the LLR sequence output by the demodulation unit 12, the decoding unit 13 performs LDPC decoding based on the parity check matrix, the code length, and the code rate of the LDPC code used by the communications device at the transmitting end. The decoding unit 13 outputs the resulting bit sequence as received data.

Based on the signal for estimation of noise conditions received from the demodulation unit 12, the reception characteristics estimation unit 14 estimates candidate elimination bits that have a high probability of being eliminated before decoding by the communications device at the receiving end. Then, while changing the parity check matrix via column replacement, the reception characteristics estimation unit 14 estimates the decoding performance when using the parity check matrix, based on the relationship between the parity check matrix and the position within the codeword of the estimated candidate elimination bits. Based on the results of estimation, the reception characteristics estimation unit 14 then determines a parity check matrix that achieves a predetermined decoding performance. The reception characteristics estimation unit 14 determines the parity check matrix for which the predetermined decoding performance is obtained with respect to every code length and code rate of the LDPC code, interleaving pattern of the codeword bit sequence, and tone map that might be indicated by a control signal input into the transmission method determining unit 15 described below.

Note that instead of "determining the parity check matrix for which the predetermined decoding performance is obtained with respect to every code length and code rate of the LDPC code, interleaving pattern of the codeword bit sequence, and tone map that might be indicated by a control signal", the reception characteristics estimation unit 14 may "determine the parity check matrix for which the predetermined decoding performance is obtained with respect to the code length and code rate of LDPC codes for which the size of the smallest stopping set (the minimum number of bits composing the stopping set), the average value of the size of the stopping sets, or the size of the most numerous stopping set, is smaller than the estimated number of candidate elimination bits". In this case, the number of processes for determining the parity check matrix is reduced.

The reception characteristics estimation unit 14 outputs the transmission method, which includes the determined parity check matrix, as well as the code length and code rate of the LDPC code, the interleaving pattern of the codeword bit sequence, and the tone map used when determining the parity check matrix, to the transmission method determining unit 15 as a recommended transmission method.

In the example shown in FIG. 9, the interleaving pattern of the codeword bit sequence is only "no interleaving", but when including an interleaving pattern of the codeword bit sequence other than "no interleaving", an interleaving unit that performs interleaving of the codeword bit sequence based on the interleaving pattern should be provided between the encoding unit 16 and the modulation unit 17.

Note that since the parity check matrix is changed via column replacement, the parity check matrices for estimation of decoding performance have the same number of rows as each other and the same number of columns as each other.

Furthermore, "changing the parity check matrix via column replacement" is an embodiment of "changing the LDPC encoding method among a plurality of LDPC encoding methods, each having the same code length and the same code rate and being defined by a different parity check matrix".

The transmission method determining unit 15 determines the transmission method, which includes the parity check matrix and the like actually used when transmitting data, from (i) the recommended transmission method, which includes a parity check matrix and the like output by the reception characteristics estimation unit 14 with respect to every code length and code rate of the LDPC code, interleaving pattern of the codeword bit sequence, and tone map that might be indicated by a control signal, and (ii) the instructions of the control signal that is input (the code length and code rate of the LDPC code, the interleaving pattern of the codeword bit sequence, and the tone map). The transmission method determining unit 15 then instructs the encoding unit 16 to perform LDPC encoding of transmission data using the code length, the code rate, and the parity check matrix of the LDPC code included in the determined transmission method. The transmission method determining unit 15 also instructs the modulation unit 17 to modulate each subcarrier in accordance with the tone map included in the determined transmission method.

The encoding unit 16 generates an encoded bit sequence by performing LDPC encoding (error correction encoding) on the transmission data using the code length, the code rate, and the parity check matrix of the LDPC code as instructed by the transmission method determining unit 15, outputting the generated encoded bit sequence to the modulation unit 17.

The modulation unit 17 maps the codeword bits received from the encoding unit 16 onto a modulated symbol (modulation of each subcarrier) using the modulation method of each subcarrier designated by the tone map as instructed by the transmission method determining unit 15. Furthermore, the modulation unit 17 generates a multicarrier modulated signal by performing multicarrier modulation on a plurality of modulated symbols and outputs the signal to the transmission unit 18.

The transmission unit 18 adds a header and the like to the multicarrier modulated signal generated by the modulation unit 17 and generates a transmission signal by performing transmission processing, such as D/A conversion and frequency conversion, outputting the transmission signal to the coupling circuit 10.

Note that in order for the communications device at the receiving end to acquire information on the code length, the code rate, and the parity check matrix of the LDPC code, as well as the interleaving pattern, the tone map, and the like, used for actual transmission, the communications device 2 stores such information in the header and transmits the header to the communications device at the receiving end. Instead of storing such information in the header and transmitting the header to the communications device at the receiving end, the communications device 2 may transmit this information to the communications device at the receiving end in advance as a separate signal from the transmission signal.

Figure 10:
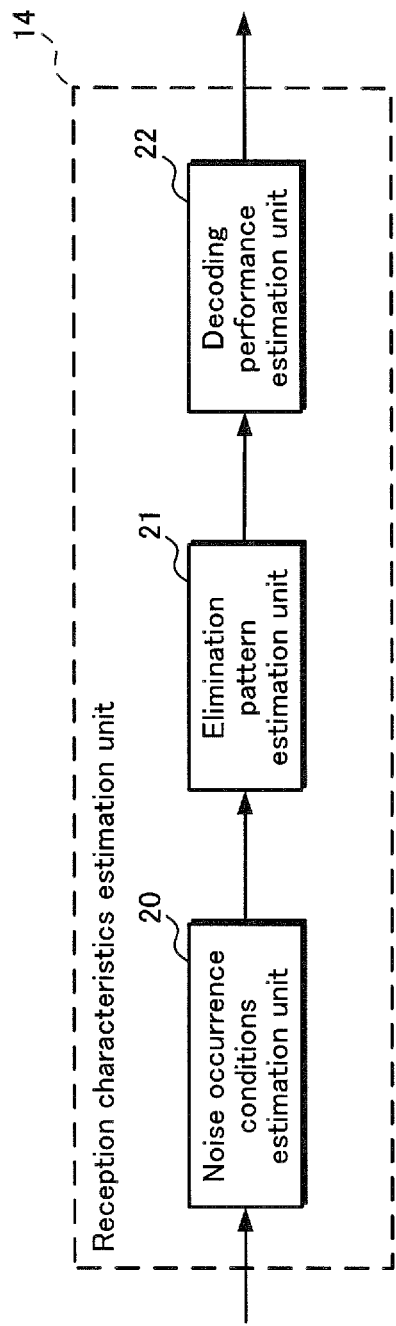
FIG. 10 shows the internal structure of the reception characteristics estimation unit 14 in FIG. 9.

FIG. 10 shows the internal structure of the reception characteristics estimation unit 14 in FIG. 9. The reception characteristics estimation unit 14 is provided with a noise occurrence conditions estimation unit 20, an elimination pattern estimation unit 21, and a decoding performance estimation unit 22.

The noise occurrence conditions estimation unit 20 estimates the occurrence conditions of noise based on the signal for estimation of noise conditions output by the demodulation unit 12. Noise occurrence conditions include frequencies (subcarrier numbers) in which strong external noise is occurring, the interval between frequencies in which external noise is occurring, the time interval between occurrence of external noise, and the like. The following, however, describes an example for estimation of subcarrier numbers in which strong external noise is occurring.

Based on the signal for estimation of noise conditions, the noise occurrence conditions estimation unit 20 detects the frequency bandwidths in which strong external noise is occurring and determines the subcarrier numbers fsc1, fsc2, . . . , fscn corresponding to the frequency bandwidths. The noise occurrence conditions estimation unit 20 then outputs the determined subcarrier numbers fsc1, fsc2, . . . , fscn to the elimination pattern estimation unit 21.

Based on the subcarrier numbers fsc1, fsc2, . . . , fscn output from the noise occurrence conditions estimation unit 20, the elimination pattern estimation unit 21 estimates the number of bits whose LLR may be set to zero during decoding processing by the communications device at the receiving end (candidate elimination bits, i.e. codeword bits having a high probability of being eliminated before decoding by the communications device at the receiving end) as well as the position (or an index of the position) of each candidate elimination bit in the codeword. Hereinafter, a sequence representing the number of candidate elimination bits and the position of each candidate elimination bit in the codeword is called an elimination pattern. The elimination pattern estimation unit 21 estimates the elimination pattern from the number of each subcarrier influenced by external noise, the tone map designated by the modulation method for each subcarrier, the code length and code rate of the LDPC code, and the interleaving pattern of the codeword bit sequence. The elimination pattern estimation unit 21 outputs the estimated elimination pattern to the decoding performance estimation unit 22. Note that the elimination pattern estimation unit 21 estimates the elimination pattern with respect to every code length and code rate of the LDPC code, interleaving pattern of the codeword bit sequence, and tone map that might be indicated by a control signal input into the transmission method determining unit 15.

While changing the parity check matrix via column replacement, the decoding performance estimation unit 22 estimates the decoding performance when using the parity check matrix, based on the relationship between the elimination pattern output by the elimination pattern estimation unit 21 and the parity check matrix. Based on the results of estimation, the decoding performance estimation unit 22 then determines a parity check matrix that achieves a predetermined decoding performance. The decoding performance estimation unit 22 determines a parity check matrix that achieves the predetermined decoding performance for all of the elimination patterns output by the elimination pattern estimation unit 21. The reception characteristics estimation unit 14 outputs the transmission method, which includes the determined parity check matrix, as well as the code length and the code rate of the LDPC code, the interleaving pattern of the codeword bit sequence, and the tone map used when determining the parity check matrix, to the transmission method determining unit 15 as a recommended transmission method.

The following describes an example of operations by the communications device 2 to determine the recommended transmission method.

The reception unit 11 performs reception processing on a signal output from the coupling circuit 10 during a non-communication period and outputs the reception-processed signal to the demodulation unit 12. The demodulation unit 12 performs multicarrier demodulation on the signal output by the reception unit 11 during the non-communication period. Since no transmission signal from another communications device is included in the signal output from the reception unit 11 during the non-communication period, the demodulation unit 12 is able to acquire a noise level in each subcarrier from the results of multicarrier demodulation. The demodulation unit 12 outputs the noise level for each subcarrier acquired based on the results of multicarrier demodulation to the reception characteristics estimation unit 14 as a signal for estimation of noise conditions. Note that in this context, the noise level may be a value determined from the signal output by the reception unit 11 for a single multicarrier modulated signal symbol region, or a statistical value such as an average or a distribution of values determined from the signal output by the reception unit 11 for a plurality of multicarrier modulated signal symbol regions.

Furthermore, since noise is impressed on the multicarrier modulated signal in the signal output from the reception unit 11 during communication, the precision of estimation of noise degrades as compared to a non-communication period. A method such as the one disclosed in Patent Literature 3, for example, may be used to acquire the noise level during communication.

Based on the signal for estimation of noise conditions from the demodulation unit 12, the noise occurrence conditions estimation unit 20 in the reception characteristics estimation unit 14 estimates the numbers of subcarriers in which strong external noise occurs. The following describes an example for the noise level shown in FIG. 8. The noise occurrence conditions estimation unit 20 compares the noise level in each subcarrier shown by the signal for estimation of noise conditions with a noise threshold Nth. The noise occurrence conditions estimation unit 20 derives numbers of subcarriers having a higher noise level than the noise threshold Nth as $fsc1, fsc2, \ldots, fscn$. In the example in FIG. 8, the total number of subcarriers is 10. When providing subcarrier numbers 1, 2, . . . , 10 in ascending order of frequency, $fsc1=2$, $fsc2=4$, and $fsc3=8$. The noise occurrence conditions estimation unit 20 outputs information on subcarrier numbers having a higher noise level than the noise threshold Nth (in the example in FIG. 8, $fsc1=2$, $fsc2=4$, and $fsc3=8$) to the elimination pattern estimation unit 21 as noise occurrence conditions.

The elimination pattern estimation unit 21 estimates the number of candidate elimination bits, i.e. codeword bits having a high probability of being eliminated before decoding by the communications device at the receiving end, as well as the position of each candidate elimination bit in the codeword (i.e. estimates the elimination pattern) from the noise occurrence conditions output by the noise occurrence conditions estimation unit 20 (the information on the subcarrier numbers having a higher noise level than the noise threshold Nth). The elimination pattern estimation unit 21 outputs the estimated elimination pattern to the decoding performance estimation unit 22. The elimination pattern estimation unit 21 estimates the elimination pattern from the numbers of subcarriers influenced by external noise, the tone map designated by the modulation method for each subcarrier, the code length and the code rate of the LDPC code, and the interleaving pattern of the codeword bit sequence. Note that the elimination pattern estimation unit 21 estimates the elimination pattern with respect to every code length and code rate of the LDPC code, interleaving pattern of the codeword bit sequence, and tone map that might be indicated by a control signal input into the transmission method determining unit 15.

In the description below, the following conditions are assumed: BPSK is used for all subcarriers in the multicarrier modulated signal, the code length of the LDPC code is 10, and interleaving is not performed.

A codeword obtained by LDPC encoding with an LDPC code having a code length of 10 is used for modulation of subcarriers in ascending order of frequency starting from the codeword bit corresponding to the first column. In other words, the codeword bits corresponding to the first column are allocated to subcarrier 1, the codeword bits corresponding to the second column are allocated to subcarrier 2, . . . , and the codeword bits corresponding to the tenth column are allocated to subcarrier 10. In this case, among the noise levels shown in FIG. 8, the numbers of subcarriers in which strong external noise occurs are $fsc1=2$, $fsc2=4$, and $fsc3=8$. Therefore, the second, fourth, and eighth codewords bits are candidate elimination bits, i.e. codeword bits having a high probability of being eliminated before decoding by the communications device at the receiving end. This case is represented as an elimination pattern in the form shown in Expression 14.

[Math 14]

$$[0,1,0,1,0,0,0,1,0,0] \qquad \text{Expression 14}$$

In the elimination pattern shown in Expression 14, the codeword bits at positions having a value of 1 are candidate elimination bits, whereas the codeword bits at positions having a value of 0 are not candidate elimination bits.

The decoding performance estimation unit 22 extracts, from the parity check matrix H of Expression 1 (code length 10, code rate 1/2), only the columns (columns 2, 4, and 8) corresponding to the codeword bits having a value of 1 in the elimination pattern of Expression 14 output by the elimination pattern estimation unit 21, and creates a partial matrix Hp from the extracted columns. Expression 15 illustrates the created partial matrix Hp.

[Math 15]

$$Hp = \begin{pmatrix} 1 & 1 & 0 \\ 1 & 0 & 1 \\ 0 & 0 & 0 \\ 1 & 1 & 1 \\ 0 & 1 & 1 \end{pmatrix} \qquad \text{Expression 15}$$

Figure 5:
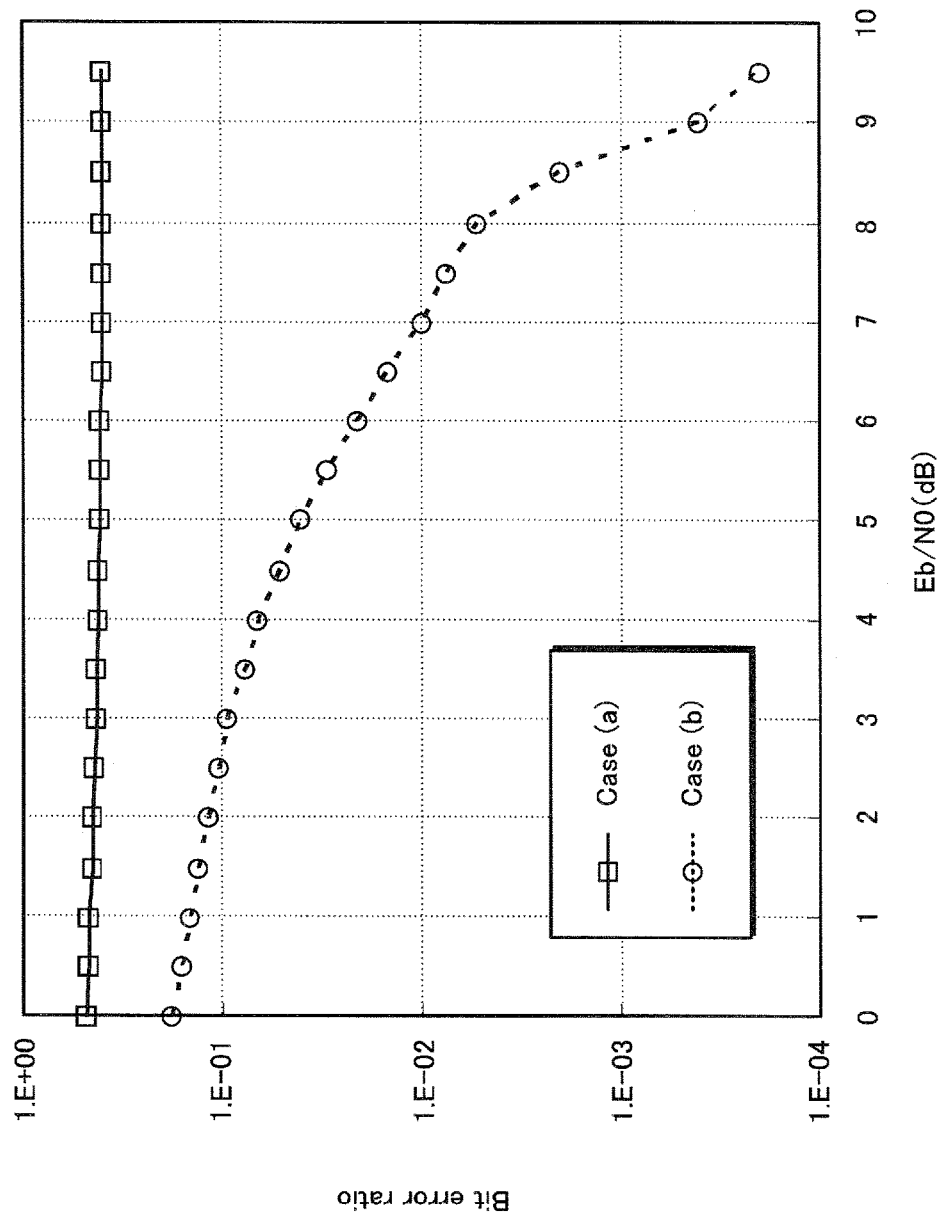
FIG. 5 shows an example of bit correction ratio characteristics in the case when eliminated bits exist.

In the partial matrix Hp shown in Expression 15, there is no row in which the row weight (the number of 1's in the row) is one. Rather, the row weight is either zero or two or greater in each row. In Non-Patent Literature 3, when no row in the created partial matrix has a row weight of one, the elimination pattern is defined as a stopping set. Therefore, the elimination pattern in Expression 14 defines a stopping set. Accordingly, when the elimination pattern in Expression 14 is formed, the bit error rate after error correction decoding drastically degrades, as shown in FIG. 5. The decoding performance estimation unit 22 determines that decoding performance is poor (i.e. a predetermined decoding performance is not achieved) when using the parity check matrix H of Expression 1 on the elimination pattern in Expression 14. Upon determining that decoding performance is poor when using the parity check matrix H, the decoding performance estimation unit 22 attempts to improve decoding performance by changing the parity check matrix via column replacement. Specifically, since it is know that decoding performance degrades when a combination of eliminated bits forms a stopping set, the decoding performance estimation unit 22 replaces columns of the parity check matrix H so that the combination of eliminated bits does not form a stopping set.

The decoding performance estimation unit 22 replaces column 2, which corresponds to a codeword bit that is 1 in the elimination pattern, with column 5, which corresponds to a codeword bit that is 0 in the elimination pattern, of the parity check matrix H represented by Expression 1 and replaces column 8, which corresponds to a codeword bit that is 1 in the elimination pattern, with column 7, which corresponds to a codeword bit that is 0 in the elimination pattern, thus creating the parity check matrix H1 shown in Expression 16.

[Math 16]

$$H1 = \begin{pmatrix} 1 & 1 & 0 & 1 & 1 & 1 & 0 & 1 & 0 & 0 \\ 1 & 1 & 0 & 0 & 1 & 0 & 1 & 0 & 1 & 1 \\ 1 & 1 & 1 & 0 & 0 & 0 & 0 & 1 & 1 & 1 \\ 0 & 0 & 1 & 1 & 1 & 1 & 1 & 0 & 1 & 0 \\ 0 & 0 & 1 & 1 & 0 & 1 & 1 & 1 & 0 & 1 \end{pmatrix} \quad \text{Expression 16}$$

The decoding performance estimation unit 22 extracts, from the parity check matrix H1 of Expression 16, only the columns (columns 2, 4, and 8) corresponding to the codeword bits having a value of 1 in the elimination pattern of Expression 14 and creates a partial matrix H1p from the extracted columns. Expression 17 illustrates the created partial matrix H1p.

[Math 17]

$$H1p = \begin{pmatrix} 1 & 1 & 1 \\ 1 & 0 & 0 \\ 1 & 0 & 1 \\ 0 & 1 & 0 \\ 0 & 1 & 1 \end{pmatrix} \quad \text{Expression 17}$$

Since the partial matrix H1p shown in Expression 17 has two rows with a row weight of 1, the combination of candidate elimination bits shown in the elimination pattern of Expression 14 does not form a stopping set for the parity check matrix H1. Therefore, by using the parity check matrix H1 in which rows have been replaced, decoding performance improves. The decoding performance estimation unit 22 determines that decoding performance is good (i.e. a predetermined decoding performance is achieved) when using the parity check matrix H1 of Expression 16 on the elimination pattern in Expression 14.

The decoding performance estimation unit 22 outputs, to the transmission method determining unit 15, a recommended transmission method that includes the parity check matrix H1 in which rows have been replaced, the code length 10 and code rate 1/2 of the LDPC code used when determining the parity check matrix H1, an indication that interleaving is not performed on the codeword bit sequence, and an indication that BPSK is used in all of the subcarriers. Note that in the present structure, the decoding performance estimation unit 22 outputs the actual parity check matrix H1 to the transmission method determining unit 15, but the present invention is not limited in this way. Alternatively, the decoding performance estimation unit 22 may transmit an index indicating the parity check matrix H1, or only a rule for replacing columns of the parity check matrix H (for example, information indicating a combination of rows to replace).

The decoding performance estimation unit 22 determines a parity check matrix that achieves the predetermined decoding performance for all of the elimination patterns output by the elimination pattern estimation unit 21 when transmitting the recommended transmission method to the transmission method determining unit 15.

The following summarizes processing by the decoding performance estimation unit 22.

Step A1

The decoding performance estimation unit 22 extracts, from the parity check matrix, only the columns corresponding to the codeword bits having a value of 1 in the elimination pattern and creates a partial matrix from the extracted columns. (The first time, the parity check matrix H is used, and the second and subsequent times, the parity check matrix obtained by column replacement in step A3 is used).

Step A2

Based on the partial matrix created in step A1, the decoding performance estimation unit 22 determines whether the combination of the positions of the candidate elimination bits within the codeword forms a stopping set.

Step A3

When the combination of the positions of the candidate elimination bits within the codeword does not form a stopping set, the decoding performance estimation unit 22 outputs, to the transmission method determining unit 15, a recommended transmission method that includes the parity check matrix that is the target of processing in step A1. On the other hand, when the combination of the positions of the candidate elimination bits within the codeword forms a stopping set, the decoding performance estimation unit 22 replaces columns of the parity check matrix H and performs the processing in step A1. Replacement of rows in the parity check matrix is performed by exchanging at least one row corresponding to a codeword bit that is 1 in the elimination pattern with at least one row corresponding to a codeword bit that is 0 in the elimination pattern. Instead of always performing column replacement on the parity check matrix H, the parity check matrix that is the target of column replacement may, for the first instance of column replacement, be the parity check matrix H, and for the second and subsequent instances of column replacement, be the parity check matrix obtained by the previous column replacement.

Note that depending on the elimination pattern, in some cases there is no pattern of column replacement that does not form a stopping set. In this case, for example, a default parity check matrix (no replacement) is used, or a parity check matrix for which the determination of formation of a stopping set was last performed is used. Alternatively, a flag may be raised indicating that the code length and code rate are not to be used, the flag being valid until the reception characteristics estimation unit 14 determines the next parity check matrix.

In the structure adopted in Embodiment 1, while changing the parity check matrix by performing column replacement, the reception characteristics estimation unit 14 estimates the decoding performance when using a parity check matrix from the relationship between the elimination pattern and the parity check matrix and determines a parity check matrix that achieves a predetermined decoding performance. However, the structure of the reception characteristics estimation unit 14 is not limited in this way and may, for example, be as follows. For each of a plurality of parity check matrices having the same number of rows and the same number of columns as each other, and in which at least a portion of the matrix elements differ, the decoding performance for the parity check matrix with respect to each of a plurality of elimination patterns may be determined in advance, and the reception characteristics estimation unit 14 may store a table showing correspondence between each elimination pattern and the parity check matrix, among the plurality of parity check matrices, for which the decoding performance is the best. The reception characteristics estimation unit 14 may then estimate noise occurrence conditions based on the signal for estimation of noise conditions from the demodulation unit 12, estimate the elimination pattern from the estimated noise occurrence conditions, and read the parity check matrix having the best decoding performance for the estimated elimination pattern from the table. With this structure, the communications device 2 need not perform processing to create a partial matrix for the elimination pattern and estimate decoding performance for each observation of noise occurrence conditions, thereby lessening the processing load on the communications device 2.

The communications device 2 determines a recommended parity check matrix during a non-communication period or when necessary during communication. Examples of when such determination is necessary during communication are when the frequency of occurrence of errors is high, or when communications are cut off.

The following describes an example of operations by the communications device 2 to transmit data using the recommended transmission method that is output by the reception characteristics estimation unit 14 to the transmission method determining unit 15.

When the communications device 2 is to transmit data, first the transmission method determining unit 15 determines the actual parity check matrix to be used based on the input from the decoding performance estimation unit 22 in the reception characteristics estimation unit 14 and on instructions included in a control signal.

For example, if the control signal designates that the code length is 10 and the code rate 1/2 for the LDPC code, that the modulation method for all subcarriers is BPSK, and that interleaving is not performed, the parity check matrix included in the recommended transmission method output by the reception characteristics estimation unit 14 is set to the parity check matrix H1. In this case, the transmission method determining unit 15 instructs the encoding unit 16 to perform LDPC encoding of transmission data using the LDPC code with code length 10, code rate 1/2, and parity check matrix H1. The transmission method determining unit 15 also instructs the modulation unit 17 to modulate each subcarrier via BPSK.

Based on the code length and code rate of the LDPC code indicated by the transmission method determining unit 15, the encoding unit 16 divides the transmission data into sections the length of an information block and performs LDPC encoding using the parity check matrix H1 indicated by the transmission method determining unit 15 on the divided transmission data in order to generate a codeword bit sequence. The encoding unit 16 outputs the generated codeword bit sequence to the modulation unit 17.

Since the modulation method for all of the subcarriers is BPSK, as indicated by the transmission method determining unit 15, the modulation unit 17 performs BPSK for all of the subcarriers on the codeword bit sequence output by the encoding unit 16 and performs multicarrier modulation on the result to generate a multicarrier modulated signal. The modulation unit 17 outputs the generated multicarrier modulated signal to the transmission unit 18.

The transmission unit 18 performs transmission processing on the multicarrier modulated signal and outputs the result to the coupling circuit 10. The coupling circuit 10 imposes the transmission signal on the power line for transmission to the communications device 3.

Figure 11:
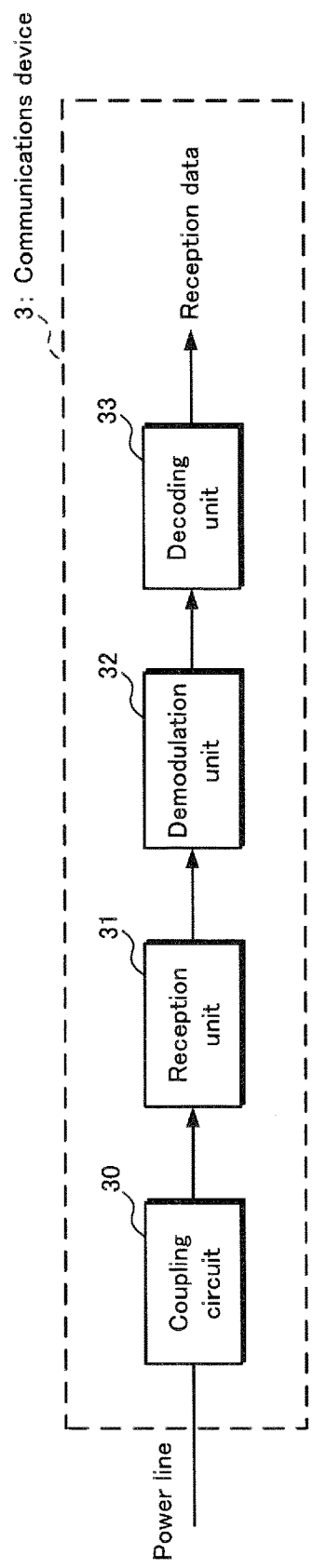
FIG. 11 shows the structure of the communications device 3 in FIG. 6.

FIG. 11 shows the structure of the communications device 3 in FIG. 6. The communications device 3 is provided with a coupling circuit 30, a reception unit 31, a demodulation unit 32, and a decoding unit 33. Note that FIG. 11 only shows the structure necessary for describing Embodiment 1. The communications device 3 may also be provided with a structure for transmitting signals. Furthermore, the communications device 3 may have a similar structure to the communications device 2 shown in FIG. 9.

The coupling circuit 30 extracts a transmission signal impressed on the power line that serves as the channel and outputs the transmission signal to the reception unit 31.

The reception unit 31 performs reception processing on the signal (the transmission signal extracted by the coupling circuit 30) transmitted over the power line that serves as the channel, such as carrier extraction, filtering, frequency conversion, synchronization, A/D conversion, and the like.

The demodulation unit 32 performs multicarrier demodulation on the reception signal output by the reception unit 31.

The demodulation unit 32 demodulates the header portion in each subcarrier. A header analysis unit, not shown in the figures, analyzes the results of processing by the demodulation unit 32 on the header portion, thus acquiring information transmitted in the header portion. For example, if the information transmitted by being attached to the header is the code length, code rate, and parity check matrix of the LDPC code, the interleaving pattern, the tone map, and the like actually used during transmission, then as a result of analysis by the header analysis unit, the communications device 3 acquires the code length, code rate, and parity check matrix of the LDPC code, the interleaving pattern, the tone map, and the like actually used during transmission. Note that in the structure of the communications device 2 shown in FIG. 9 and the communications device 3 shown in FIG. 11, the interleaving pattern is "no interleaving", but when including an interleaving pattern other than "no interleaving", a deinterleaving unit that performs deinterleaving on the LLR sequence based on a deinterleaving pattern opposite from the interleaving pattern should be provided between the demodulation unit 32 and the decoding unit 33.

The demodulation unit 32 demodulates the payload portion in each subcarrier in accordance with the tone map used by the communications device at the transmitting end and calculates the LLR of each received codeword bit. In this case, as described above, the demodulation unit 32 eliminates codeword bits by setting the LLR to zero for bits determined to have been strongly influenced by external noise. The demodulation unit 32 outputs an LLR sequence to the decoding unit 33. Note that the demodulation unit 32 determines that a bit has been influenced by powerful external noise if the LLR is larger than a predetermined threshold, for example.

Using the LLR sequence output by the demodulation unit 32, the decoding unit 33 performs LDPC decoding based on the parity check matrix, the code length, and the code rate of the LDPC code used by the communications device at the transmitting end. The decoding unit 13 outputs the resulting bit sequence as received data. In this context, there is a correlation between the external noise that influences the communications device 3 and the external noise that influences the communications device 2, due to the principle behind the occurrence of noise. From the conditions of external noise that the communications device 2 itself estimates, the communications device 2 determines the parity check matrix actually used to code transmission data, taking into consideration the elimination pattern provided by the demodulation unit 32 of the communications device 3. The communications device 2 then uses the determined parity check matrix to code transmission data and transmits a transmission signal. Therefore, even if the demodulation unit 32 eliminates the bits that receive the influence of external noise (i.e. sets LLR to zero), degradation of decoding performance by the decoding unit 33 is reduced.

With the communications device 2 and the communications device 3 described above, in the case when decoding performance by the reception device degrades when using a parity check matrix for which combinations of codeword bits are eliminated due to the influence of external noise, the parity check matrix used for encoding of transmission data is changed to a different parity check matrix. Therefore, decoding performance by the reception device is improved without changing the code length or the code rate.

Supplementary explanation and modifications for Embodiment 1 follow.

(1) The following describes a method for implementing LDPC encoding using a parity check matrix and LDPC decoding based on a parity check matrix.

(1-1) A method of implementing encoding using a parity check matrix is to adopt a structure in which the encoding unit 16 stores every parity check matrix that might be used, selects one of the stored parity check matrices in response to an instruction from the transmission method determining unit 15, and performs LDPC encoding of transmission data.

On the other hand, a method of implementing decoding based on a parity check matrix is to adopt a structure in which the decoding unit 33 stores every parity check matrix that might be used, selects one of the stored parity check matrices in response to data transmitted by the communications device at the transmitting end, and performs LDPC decoding on the likelihood bit sequence.

However, in these methods of implementation, the encoding unit 16 and the decoding unit 33 need to store every parity check matrix that might be used, thus increasing the circuit scale of the encoding unit 16 and the decoding unit 33. Therefore, the following two other methods of implementation, (1-2) and (1-3), may be used.

(1-2) The encoding unit only stores the basic parity check matrix H. The transmission method determining unit 15 outputs a rule for replacing columns of the parity check matrix H (a rule for replacing columns of the parity check matrix H so as to obtain the parity check matrix used for performing actual LDPC encoding of transmission data). The encoding unit replaces columns of the parity check matrix H in accordance with the rule output by the transmission method determining unit 15 for replacing columns of the parity check matrix H. The encoding unit then performs LDPC encoding of transmission data using the parity check matrix resulting from column replacement.

The decoding unit only stores the basic parity check matrix H. The communications device at the transmitting end transmits a rule for replacing columns of the parity check matrix H (a rule for replacing columns of the parity check matrix H so as to obtain the parity check matrix used for performing actual LDPC encoding of transmission data). The decoding unit replaces columns of the parity check matrix H in accordance with the rule transmitted by the communications device at the transmitting end for replacing columns of the parity check matrix H. The decoding unit then performs LDPC decoding of the likelihood bit sequence using the parity check matrix resulting from column replacement.

With this structure, the encoding unit and the decoding unit only need store the basic parity check matrix H, thereby reducing the circuit scale of the encoding unit and the decoding unit.

(1-3) The encoding unit does not perform LDPC encoding using a parity check matrix resulting from replacing columns of the basic parity check matrix H. Rather, the encoding unit performs LDPC encoding using the basic parity check matrix H and then exchanges codeword bits within the codeword for the resulting codeword bit sequence in accordance with an exchange rule corresponding to a rule for replacing columns in the parity check matrix H output by the transmission method determining unit 15. In this way, the LDPC encoding performed by the encoding unit only uses the basic parity check matrix H, thereby reducing the circuit scale of the encoding unit. For example, if the rule for replacing columns of the parity check matrix H is to replace columns K and L (K # L), the exchange rule corresponding to the rule for replacing columns would be to exchange the $K^{th}$ codeword bit and the $L^{th}$ codeword bit in the codeword.

This method of implementation is one embodiment of "determining, from a plurality of exchange rules for exchanging codeword bits within a codeword, an exchange rule corresponding to occurrence conditions of external noise as an exchange rule for exchanging codeword bits within a codeword in a codeword bit sequence; generating a codeword bit sequence by performing LDPC encoding on transmission data, and exchanging codeword bits within a codeword of the generated codeword bit sequence in accordance with the determined exchanging rule". Note that the rule for replacing columns of the basic parity check matrix H corresponds to the exchange rule for codeword bits in the codeword.

The decoding unit does not perform LDPC decoding based on a parity check matrix resulting from replacing columns of the basic parity check matrix H. Rather, the decoding unit exchanges bits in the likelihood bit sequence in accordance with an exchange rule opposite to the exchange rule for bits that corresponds to the rule for replacing columns of the basic parity check matrix H transmitted by the communications device at the transmitting end. The decoding unit then performs LDPC decoding based on the basic parity check matrix H using the LLR sequence in which bits have been exchanged. With this structure, the decoding performed by the decoding unit is only LDPC decoding based on the basic parity check matrix H, thereby reducing the circuit scale of the decoding unit.

This modification is one embodiment of "exchanging bits in accordance with an exchange rule opposite to the exchange rule used to exchange codeword bits of an LLR sequence to perform LDPC decoding based on the parity check matrix on the LLR sequence whose bits have been exchanged".

Note that in (1-2) and (1-3), there is only one basic parity check matrix. However, the number of basic parity check matrices may easily be expanded to two or greater.

(2) Embodiment 1 is an example of a structure in which, when the combination of the positions, within the codeword, of the candidate elimination bits indicated by the elimination pattern forms a stopping set for the parity check matrix, the parity check matrix is changed via column replacement to yield a combination that does not form a stopping set. However, the present invention is not limited in this way.

For example, even when the combination of the positions, within the codeword, of the candidate elimination bits indicated by the elimination pattern does not form a stopping set for the parity check matrix, the parity check matrix may be changed in order to improve decoding performance.

Specifically, decoding performance tends to improve when many rows in the partial matrix have a row weight of 0 or 1, or when rows having a row weight of 2 or greater have a lower row weight. Based on this tendency, a method may be adopted to replace columns in the parity check matrix in order to increase the number of rows in the partial matrix having a row weight of 0 or 1 or decrease the maximum value of the row weights of the partial matrix.

The following describes examples of such methods. For each of a plurality of parity check matrices, the communications device 2 creates a partial matrix by extracting, from the parity check matrix, columns corresponding to candidate elimination bits indicated by an elimination pattern. Based on the partial matrix corresponding to each of the plurality of parity check matrices, the communications device 2 determines the parity check matrix for use in LDPC encoding of transmission data by selecting, from parity check matrices for which the combination of the positions, within the codeword, of the candidate elimination bits indicated by the elimination pattern does not form a stopping set, a parity check matrix in which the largest number of rows in the partial matrix have a row weight of 0 or 1. Alternatively, based on the partial matrix corresponding to each of the plurality of parity check matrices, the communications device 2 determines the parity check matrix for use in LDPC encoding of transmission data by selecting, from parity check matrices for which the combination of the positions, within the codeword, of the candidate elimination bits indicated by the elimination pattern does not form a stopping set, a parity check matrix in which the maximum value of weighting of the partial matrix is smallest.

(3) In Embodiment 1, a structure to improve decoding performance by replacing columns of the parity check matrix has been described, but the present invention is not limited to this structure. For example, a structure may be adopted whereby when it is determined that decoding performance for an estimated elimination pattern is poor, the interleaving pattern of the codeword bit sequence is changed in order to exchange a codeword bit determined to be a candidate elimination bit with another codeword bit in order to improve decoding performance. In this way, it is not necessary for the encoding unit of the communications device to store a plurality of parity check matrices. Similarly, it is not necessary for the decoding unit of the communications device to store a plurality of parity check matrices.

Figure 12:
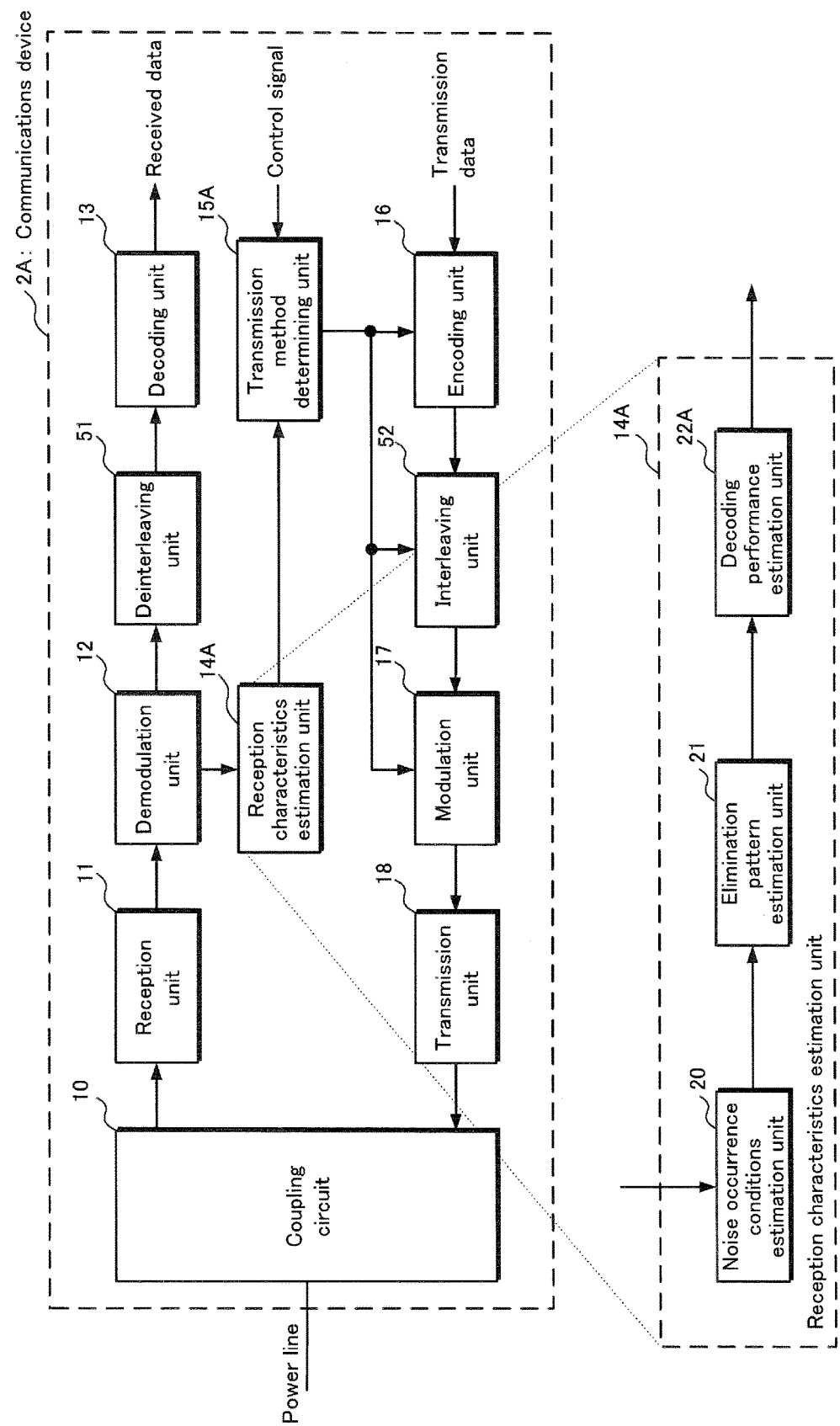
FIG. 12 shows the structure of a communications device 2A, which has a function to change the interleaving pattern of a codeword bit sequence, in a modification of Embodiment 1 of the present invention.
Figure 13:
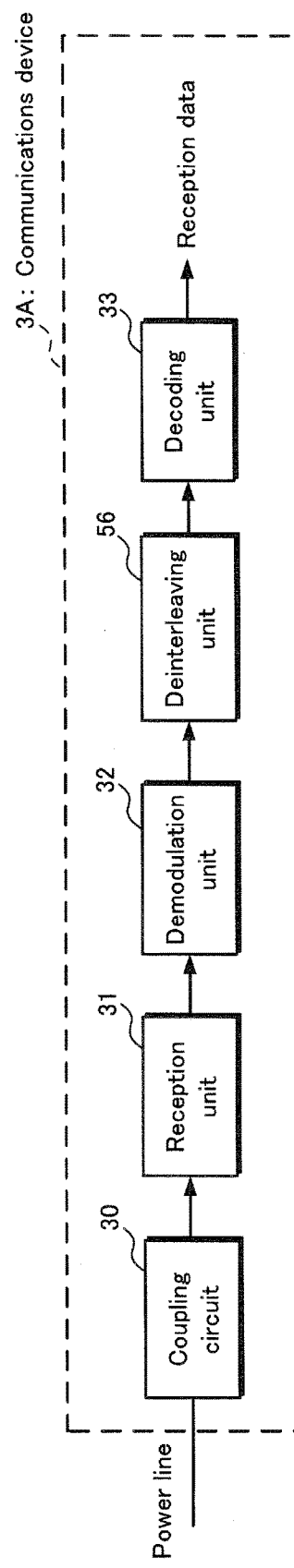
FIG. 13 shows the structure of a communications device 3A that performs PLC with the communications device 2A in FIG. 12.

With reference to FIGS. 12 and 13, the following describes a communications device 2A, which has a function to change the interleaving pattern of the codeword bit sequence, and a communications device 3A, which performs PLC with the communications device 2A.

The communications device 2A, which has a function to change the interleaving pattern of the codeword bit sequence, shown in FIG. 12 differs from the communications device 2 described with reference to FIGS. 9 and 10 in that the reception characteristics estimation unit 14 is replaced by a reception characteristics estimation unit 14A that includes a decoding performance estimation unit 22A instead of the decoding performance estimation unit 22, and the transmission method determining unit 15 is replaced by the transmission method determining unit 15A. The communications device 2A also further includes a deinterleaving unit 51 and an interleaving unit 52. Since the communications device 2 changes the interleaving pattern of the codeword bit sequence, in the following description, the elimination pattern estimation unit 21 in the reception characteristics estimation unit 14A is assumed to have estimated the elimination pattern for when interleaving is not performed in order to simplify explanation.

In accordance with a deinterleaving pattern, the decoding performance estimation unit 22A deinterleaves the elimination pattern output by the elimination pattern estimation unit 21. Based on the relationship between the parity check matrix and the elimination pattern deinterleaved in accordance with the deinterleaving pattern, the decoding performance estimation unit 22A estimates the decoding performance by the communications device at the receiving end when the codeword bit sequence is interleaved in accordance with the opposite interleaving pattern than the deinterleaving pattern. When the estimated decoding performance is poor (when a predetermined decoding performance is not achieved), the decoding performance estimation unit 22A attempts to improve decoding performance by changing the deinterleaved elimination pattern through use of a different deinterleaving pattern. The decoding performance estimation unit 22A determines the deinterleaving pattern for improved decoding performance (the deinterleaving pattern that achieves the predetermined decoding performance) and determines the interleaving pattern that is opposite to the determined deinterleaving pattern. The decoding performance estimation unit 22A determines an interleaving pattern that achieves the predetermined decoding performance for all of the elimination patterns output by the elimination pattern estimation unit 21. The reception characteristics estimation unit 14A outputs the transmission method, which includes the determined interleaving pattern, as well as the code length and the code rate of the LDPC code and the tone map used when determining the interleaving pattern, to the transmission method determining unit 15A as a recommended transmission method.

The following further describes processing by the decoding performance estimation unit 22A.

Step B1

In accordance with a deinterleaving pattern, the decoding performance estimation unit 22A deinterleaves the elimination pattern. A different deinterleaving pattern is used each time step B1 is performed.

Step B2

The decoding performance estimation unit 22A extracts, from the parity check matrix H, only the columns corresponding to the codeword bits having a value of 1 in the elimination pattern deinterleaved in step B1 and creates a partial matrix from the extracted columns.

Step B3

Based on the partial matrix created in step B2, the decoding performance estimation unit 22A determines whether the combination of the positions of the candidate elimination bits within the codeword forms a stopping set.

Step B4

When the combination of the positions of the candidate elimination bits within the codeword does not form a stopping set, the decoding performance estimation unit 22A determines the interleaving pattern that is opposite to the deinterleaving pattern used to deinterleave the elimination pattern in step B1 and outputs, to the transmission method determining unit 15A, a recommended transmission method that includes the determined interleaving pattern. On the other hand, when the combination of the positions of the candidate elimination bits within the codeword forms a stopping set, the decoding performance estimation unit 22A performs the processing in step B1.

Note that depending on the elimination pattern, in some cases there is no deinterleaving pattern that does not form a stopping set. In this case, for example, an interleaving pattern that is opposite to a default deinterleaving pattern (the deinterleaving pattern for which formation of a stopping set was first determined) is used, or an interleaving pattern that is opposite to the deinterleaving pattern for which the determination of formation of a stopping set was last performed is used. Alternatively, a flag may be raised indicating that the code length and code rate of the parity check matrix H are not to be used, the flag being valid until the reception characteristics estimation unit 14A determines the next deinterleaving pattern.

An example has been described of a structure in which, when the combination of the positions, within the codeword, of the candidate elimination bits indicated by the deinterleaved elimination pattern forms a stopping set for the parity check matrix H, the deinterleaving pattern is changed so that the combination does not form a stopping set. However, the present invention is not limited in this way.

For example, even when the combination of the positions, within the codeword, of the candidate elimination bits indicated by the deinterleaved elimination pattern does not form a stopping set for the parity check matrix H, the deinterleaving pattern for the elimination pattern (i.e. the interleaving pattern of the codeword bit sequence) may be changed in order to improve decoding efficiency.

Specifically, decoding performance tends to improve when many rows in the partial matrix have a row weight of 0 or 1, or when rows having a row weight of 2 or greater have a lower row weight. Based on this tendency, a method may be adopted to change the deinterleaving pattern for the elimination pattern (i.e. the interleaving pattern of the codeword bit sequence) in order to increase the number of rows in the partial matrix having a row weight of 0 or 1 or decrease the maximum value of the row weights of the partial matrix.

The following describes examples of such methods. For each of a plurality of deinterleaving patterns, the communications device 2A creates a partial matrix by extracting, from the parity check matrix H, columns corresponding to candidate elimination bits indicated by a deinterleaved elimination pattern. Based on the partial matrix corresponding to each of the plurality of deinterleaving patterns, the communications device 2A determines the interleaving pattern for the codeword bit sequence to be the interleaving pattern opposite to the deinterleaving pattern in which a larger number of rows in the partial matrix have a row weight of 0 or 1 among deinterleaving patterns for which the combination of the positions, within the codeword, of the candidate elimination bits indicated by the deinterleaved elimination pattern does not form a stopping set. Alternatively, the communications device 2A may determine the interleaving pattern for the codeword bit sequence to be the interleaving pattern opposite to the deinterleaving pattern in which the maximum value of weighting of the partial matrix is smaller among deinterleaving patterns for which the combination of the positions, within the codeword, of the candidate elimination bits indicated by the deinterleaved elimination pattern does not form a stopping set.

In the above description, a structure is adopted in which the reception characteristics estimation unit 14A estimates the decoding performance from the relationship between the deinterleaved elimination pattern and the parity check matrix while changing the deinterleaving pattern, determines the deinterleaving pattern that achieves a predetermined decoding performance, and determines the interleaving pattern that is opposite to the determined deinterleaving pattern. The structure of the reception characteristics estimation unit 14A is not limited in this way, however, and may for example be as follows. For a plurality of elimination patterns, the decoding performance of the parity check matrix for a deinterleaved elimination pattern may be determined in advance based on each of a plurality of deinterleaving patterns, and the reception characteristics estimation unit 14A may store a table showing correspondence between each elimination pattern and the deinterleaving pattern, among the plurality of deinterleaving patterns, for which the decoding performance is the best. The reception characteristics estimation unit 14A may then estimate noise occurrence conditions based on the signal for estimation of noise conditions from the demodulation unit 12, estimate the elimination pattern from the estimated noise occurrence conditions, read the deinterleaving pattern having the best decoding performance for the estimated elimination pattern from the table, and determine the interleaving pattern that is opposite to the read deinterleaving pattern. With this structure, the communications device 2A need not perform processing to create a partial matrix for the elimination pattern and estimate decoding performance for each observation of noise occurrence conditions, thereby lessening the processing load on the communications device 2A. Note that instead of being a deinterleaving pattern applied to the elimination pattern, the information corresponding to the elimination pattern may be an interleaving pattern applied to the codeword bit sequence (a pattern that is opposite to the deinterleaving pattern applied to the elimination pattern), for example.

The transmission method determining unit 15A determines the recommended transmission method corresponding to instructions by the control signal to be the actually used transmission method. The transmission method determining unit 15A then instructs the encoding unit 16 to perform LDPC encoding of transmission data using the code length, the code rate, and the parity check matrix of the LDPC code included in the determined transmission method. The transmission method determining unit 15A also instructs the interleaving unit 52 to interleave the codeword bit sequence with the interleaving pattern included in the determined transmission method. Furthermore, the transmission method determining unit 15A instructs the modulation unit 17 to modulate each subcarrier in accordance with the tone map included in the determined transmission method.

The interleaving unit 52 interleaves the codeword bit sequence output by the encoding unit 16 in accordance with the interleaving pattern indicated by the transmission method determining unit 14A. The interleaving unit 52 outputs the interleaved codeword bit sequence to the modulation unit 17.

The deinterleaving unit 51 deinterleaves the LLR sequence output by the demodulation unit 12 using the deinterleaving pattern opposite to the interleaving pattern used by the interleaving unit of the communications device that transmitted the received signal, thus restoring the interleaved sequence to its original form. The deinterleaving unit 51 outputs the deinterleaved LLR sequence to the decoding unit 13.

The communications device 3A shown in FIG. 13 performs PLC with the communications device 2A shown in FIG. 12. As compared to the communications device 3 in FIG. 11, the communications device 3A further includes a deinterleaving unit 56. The deinterleaving unit 56 deinterleaves the LLR sequence output by the demodulation unit 12 using the deinterleaving pattern opposite to the interleaving pattern used by the interleaving unit 52 of the communications device 2A at the transmitting end, thus restoring the interleaved sequence to its original form. The deinterleaving unit 56 outputs the deinterleaved LLR sequence to the decoding unit 33. Note that the communications device 2A notifies the communications device 2B of the interleaving pattern by storing the interleaving pattern in the header. The method of notification is not, however, limited in this way. For example, the communications device 2A may notify the communications device 2B of the interleaving pattern using a different signal than the transmission signal.

(4) In the above example, the case has been described in which the tone map indicated to be used for all of the subcarriers is BPSK, yet the tone map is not limited in this way. Multi-level Phase Shift Keying (PSK), Quadrature Amplitude Modulation (QAM), or Pulse Amplitude Modulation (PAM) may be used, or a different modulation method may be used for each subcarrier. In this case, the standard for estimating the number of eliminations, the length of the elimination pattern, and the position of eliminated bits from the noise occurrence conditions differ according to the modulation method. For example, when using QPSK, since two bits are transmitted in one subcarrier, there is a possibility of two bits simultaneously being eliminated when a subcarrier is influenced by external noise. The elimination pattern estimation unit 21 estimates the elimination pattern taking into consideration the modulation method (number of transmitted bits) used in each subcarrier during transmission.

(5) The communications device 2 of Embodiment 1 adopts a structure for, during a non-communication period, observing noise occurrence conditions, estimating an elimination pattern and decoding performance from the observed noise occurrence conditions with respect to every code length, code rate, interleaving pattern, and tone map that might be indicated by a control signal, and determining a parity check matrix that achieves a predetermined decoding performance. The parity check matrix is then used during data transmission. However, the present invention is not limited to this structure. For example, the communications device 2 may observe noise occurrence conditions during a non-communication period, and then at the time of data transmission, determine an elimination pattern from the observed noise occurrence conditions in accordance with the code length, code rate, interleaving pattern, and tone map indicated by the control signal, and determine a parity check matrix that achieves good decoding performance With this structure, it is not necessary to determine, during a non-communication period, a parity check matrix that achieves a predetermined decoding performance with respect to every code length, code rate, interleaving pattern, and tone map that might be indicated by the control signal. Rather, it suffices to determine a parity check matrix that obtains a predetermined decoding performance under the actual conditions of data transfer. Note that the same modification may be made to the above structure of (3), for example, wherein the interleaving pattern of the codeword bit sequence is determined.

(6) The communications device 2 of Embodiment 1 has been described as replacing columns of the basic parity check matrix, or reordering the bit codeword sequence (as in (1-3) above, for example) in order to improve decoding performance under the conditions of the elimination pattern estimated by the elimination pattern estimation unit 21. However, the communications device 2 is not limited to this structure. For example, the communications device 2 may select the parity check matrix having the best decoding performance as the recommended parity check matrix from a plurality of mutually independent parity check matrices having equal code lengths and equal code rates. In this context, "independent" refers to the relationship between matrices when the matrices cannot be made equal via column replacement, row replacement, or addition of multiple rows. In this case, the communications device 2 needs to store a plurality of independent parity check matrices. When column replacement alone, however, does not suffice to avoid degradation of decoding performance, decoding performance may be improved by using an independent parity check matrix.

(7) In Embodiment 1, the correlation between the external noise observed by the communications device 2 and the external noise observed by the communications device 3 is exploited in order for the communications device 2 to perform multicarrier demodulation on a signal output by the reception unit 11 during a non-communications period, estimate an elimination pattern from the noise level in each subcarrier, and use the estimated elimination pattern to estimate decoding performance.

The following describes a communications system wherein the communications device at the receiving end provides feedback to the communications device at the transmitting end on noise occurrence conditions when the correlation between the external noise observed at the communications device at the transmitting end and the external noise observed at the communications device at the receiving end is low.

Figure 14:
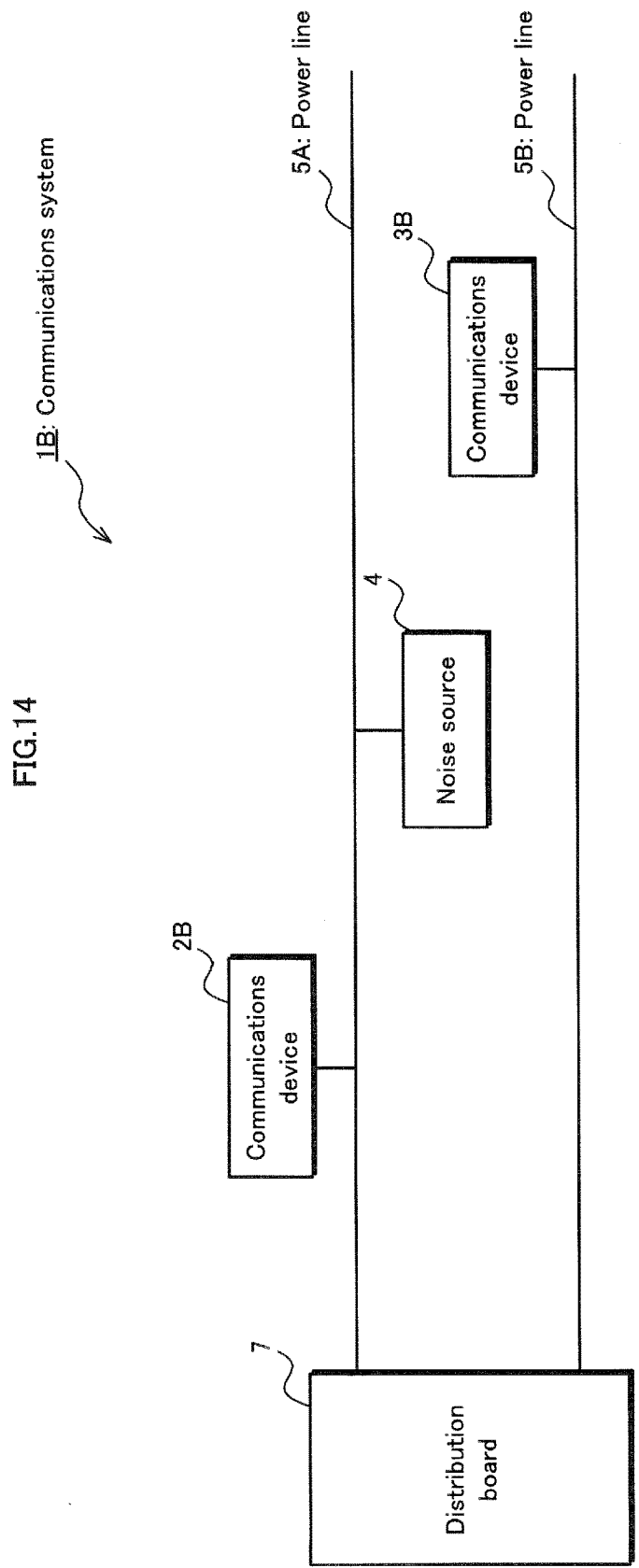
FIG. 14 shows the structure of a communications system 1B in a modification of Embodiment 1 of the present invention.

FIG. 14 shows the structure of a communications system in a modification of Embodiment 1. The communications system 1B in FIG. 14 shows an example of communications when a communications device 2B connected to a power line 5A and a communications device 3B connected to a power line 5B communicate across a distribution board 7. In this case, the noise source 4 producing the external noise exists along the same line as the communications device 2B. It is known that in PLC, the signal level decays greatly during transmission across a distribution board. Furthermore, when the high-frequency band is used for signal transmission during PLC, since the channel characteristics from the noise source to the communications device are different for each communications device, external noise that could not be observed by the communications device 2B at the transmitting end due to the influence of the channel characteristics may greatly influence the communications device 3B at the receiving end. In this case, the correlation between the external noise observed by the communications device 2B and the external noise observed by the communications device 3B is low. As a result, the elimination pattern indicating the arrangement of candidate elimination bits estimated by the communications device 2B and the elimination pattern indicating the arrangement of bits actually eliminated during decoding by the communications device 3B may differ, in which case decoding performance does not improve by controlling the parity check matrix based on observation of external noise by the communications device 2B. In order to resolve this problem, a structure is provided for the communications device 3B to provide the communications device 2B with feedback on the elimination pattern used during decoding when decoding performance is poor.

Figure 15:
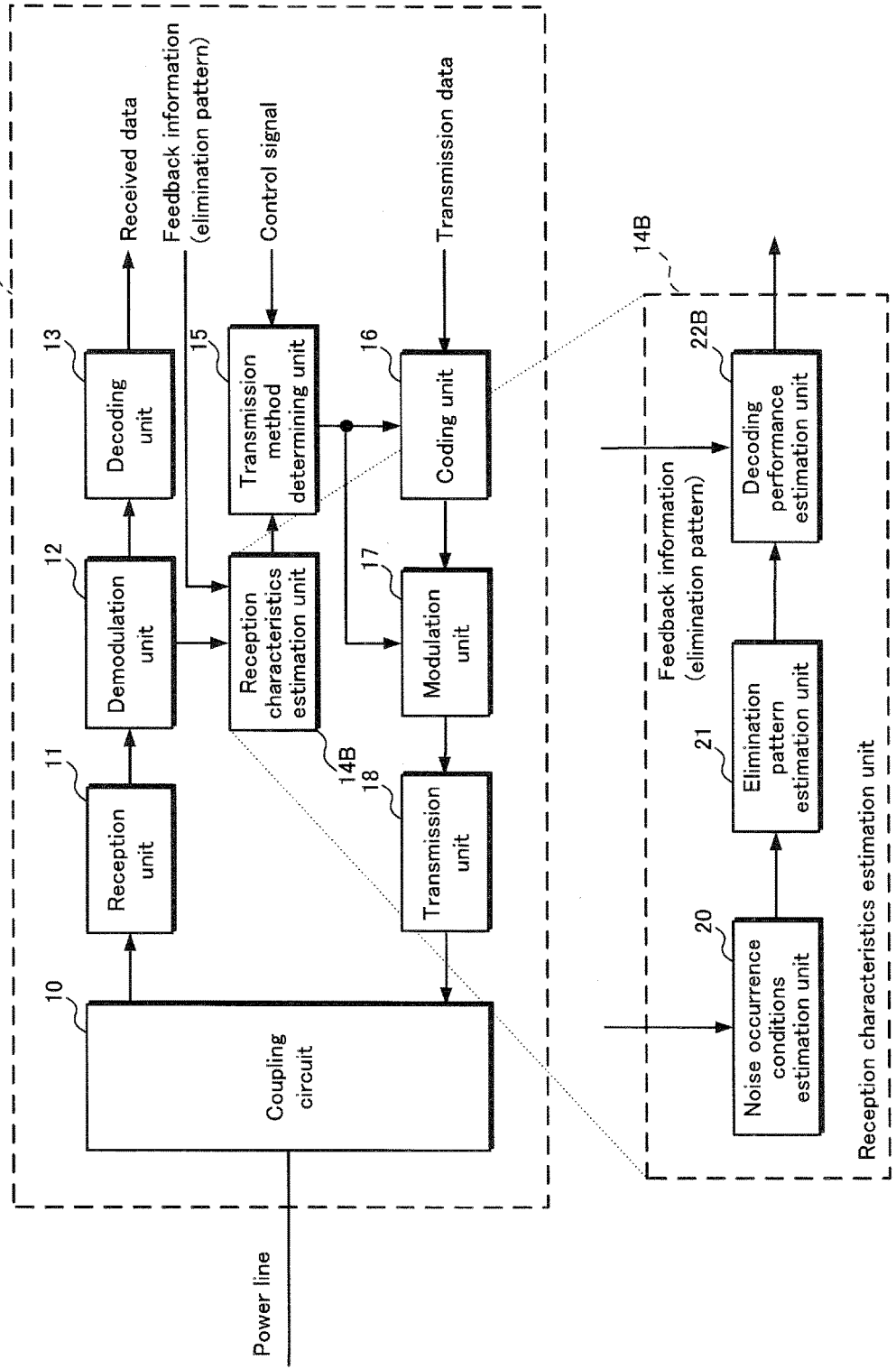
FIG. 15 shows the structure of the communications device 2B in FIG. 14.
Figure 16:
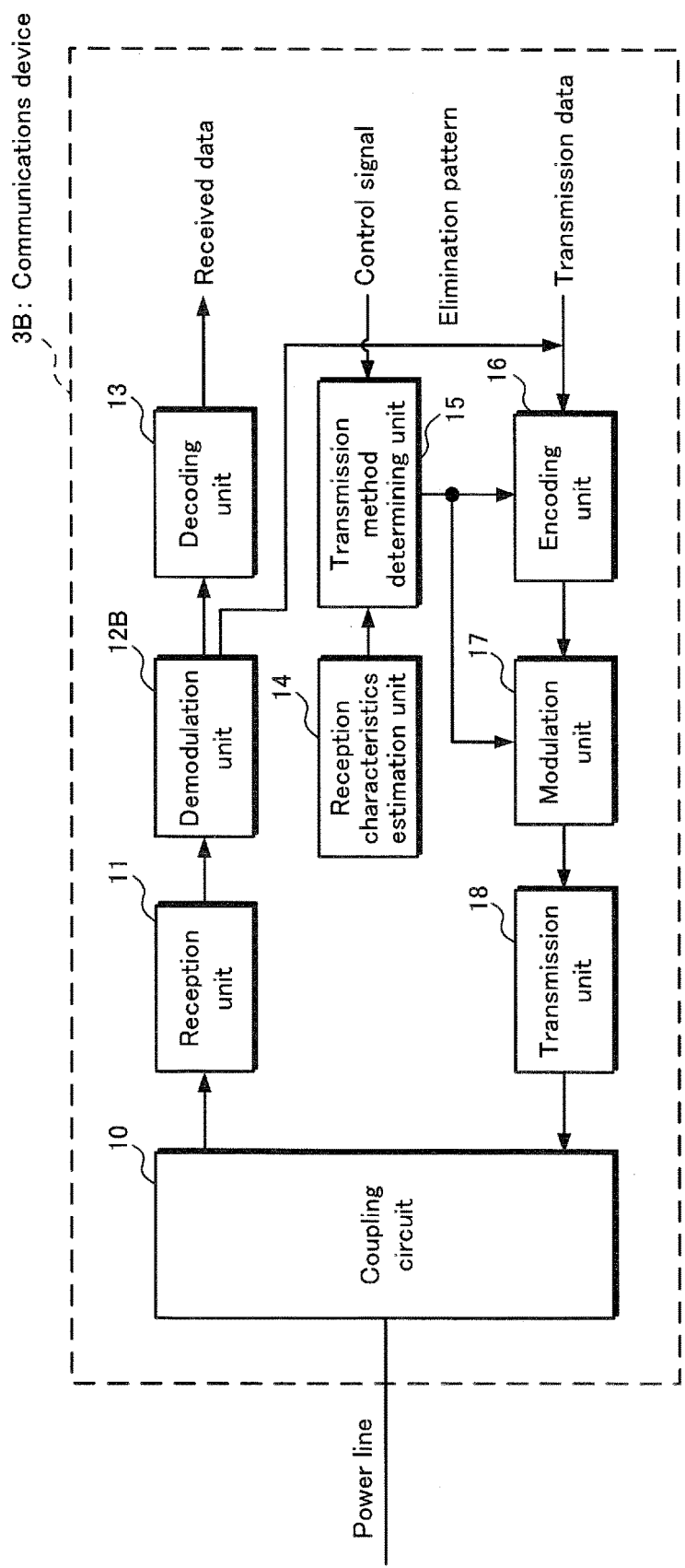
FIG. 16 shows the structure of the communications device 3B in FIG. 14.

FIG. 15 shows the structure of the communications device 2B in FIG. 14, and FIG. 16 shows the structure of the communications device 3B in FIG. 14.

The communications device 2B shown in FIG. 15 differs from the communications device 2 shown in FIGS. 9 and 10 in that the reception characteristics estimation unit 14 is replaced by a reception characteristics estimation unit 14B that includes a decoding performance estimation unit 22B instead of the decoding performance estimation unit 22. Until receiving, from the communications device 3B, feedback on an elimination pattern corresponding to bits eliminated by a demodulation unit 12B, described below, in the communications device 3B (i.e. an elimination pattern showing the number of codeword bits eliminated by the demodulation unit 12B and the position within the codeword of each eliminated codeword bit), the decoding performance estimation unit 22B determines a parity check matrix for which decoding performance is good (i.e. for which a predetermined decoding performance is achieved) using the elimination pattern output by the elimination pattern estimation unit 21 and outputs a recommended transmission method, which includes the determined parity check matrix, to the transmission method determining unit 15. After the communications device 2B receives, from the communications device 3B, feedback on an elimination pattern corresponding to bits eliminated by the demodulation unit 12B, described below, in the communications device 3B, the decoding performance estimation unit 22B determines a parity check matrix for which decoding performance is good (i.e. for which a predetermined decoding performance is achieved) using the received elimination pattern and outputs a recommended transmission method, which includes the determined parity check matrix, to the transmission method determining unit 15.

The communications device 3B shown in FIG. 16 differs from the communications device 2 of Embodiment 1 in that the demodulation unit 12 is replaced by a demodulation unit 12B. The demodulation unit 12B performs multicarrier demodulation on the signal received from the reception unit 11. The demodulation unit 12B demodulates each subcarrier in accordance with a tone map indicated by the modulation method for each subcarrier of the multicarrier modulated signal as used by the communications device that transmitted the received signal and calculates the LLR of each transmitted codeword bit. In this case, as described above, the demodulation unit 12B eliminates codeword bits by setting the LLR to zero for bits determined to have been strongly influenced by external noise. The demodulation unit 12B outputs an LLR sequence to the decoding unit 13. The demodulation unit 12B also creates an elimination pattern corresponding to the eliminated codeword bits (an elimination pattern showing the number of eliminated codeword bits and the position within the codeword of each eliminated codeword bit) and outputs the created elimination pattern.

The communications device 3B stores the elimination pattern output by the demodulation unit 12B until the next time of transmission of a signal to the communications device 2B. When transmitting data such as an acknowledgement signal (ACK) or a non-acknowledgement signal (NACK), for example, to the communications device 2B, the communications device 3B includes in these signals the elimination pattern output by the demodulation unit 12B at the time of receipt of a signal from the communications device 2B.

The communications device 2B receives data from the communications device 3B that includes the elimination pattern and obtains the elimination pattern through processing by the coupling circuit 10, reception unit 11, demodulation unit 12, and decoding unit 13. The obtained elimination pattern is input into the decoding performance estimation unit 22B of the reception characteristics estimation unit 14B in order to determine the parity check matrix to be used during the next transmission to the communications device 3B. The decoding performance estimation unit 22B uses the input elimination pattern (the elimination pattern transmitted from the communications device 3B) to determine a parity check matrix that achieves a predetermined decoding performance.

At the time of transmission to the communications device 3B, the communications device 2B determines the parity check matrix used to encode transmission data based on the results of processing by the decoding performance estimation unit 22B, performs LDPC encoding and the like on the transmission data, and transmits a signal to communications device 3B.

In this way, even when the correlation is low between the external noise observed by the communications device 2B and the external noise observed by the communications device 3B, transmission with good decoding performance in the communications device 3B is achieved.

Note that a structure to provide feedback on the elimination pattern output by the demodulation unit of the communications device at the receiving end may be adapted to a structure for replacing codeword bits within a codeword in the codeword bit sequence (a structure corresponding to the above (1-3), for example), or to a structure for interleaving the codeword bit sequence (a structure corresponding to the above (3), for example).

Furthermore, the information transmitted from the communications device 3B to the communications device 2B need not be the elimination pattern itself. For example, the decoding performance estimation unit in the reception characteristics estimation unit of the communications device 3B may determine the parity check matrix for which decoding performance is good (i.e. a predetermined decoding performance is achieved) from the elimination pattern output by the demodulation unit 12B. The decoding performance estimation unit may then set the transmission method, which includes the determined parity check matrix, as well as the code length and the code rate of the LDPC code, the interleaving pattern of the codeword bit sequence, and the tone map used when determining the parity check matrix, as a recommended transmission method, include information on the recommended transmission method in the transmission data, and transmit the transmission data to the communications device 2B. Upon receiving the transmission data that includes the recommended transmission method, the communications device 2B includes the recommended transmission method in a control signal upon the next transmission to the communications device 3B and outputs a signal to the transmission method determining unit indicating to perform transmission processing based on the information included in the recommended transmission method designated by the control signal. The transmission method determining unit determines the recommended transmission method designated by the signal to be the transmission method and instructs the encoding unit 16 and the modulation unit 17 to perform encoding and modulation using the determined transmission method.

Embodiment 2

Embodiment 1 describes a structure for changing the parity check matrix used for LDPC encoding, the interleaving pattern of the codeword bit sequence, or the like in order to improve decoding performance. Embodiment 2, on the other hand, describes changing the tone map that designates the modulation method of each subcarrier in the multicarrier modulated signal. Note that in Embodiment 2, structural elements that are substantially the same as in Embodiment 1 bear the same reference signs, and a description thereof is omitted in Embodiment 2, since the same description as in Embodiment 1 applies.

It has already been explained that in an environment with external noise, the influence of external noise on decoding is reduced by decoding after setting the LLR of codeword bits that are strongly influenced by external noise to zero.

In Embodiment 1, the case of using BPSK for all subcarriers of the multicarrier modulated signal has been described as a specific example. In this case, the number of codeword bits transmitted in one subcarrier is one, and therefore the number of eliminated bits for one subcarrier that is influenced by external noise is one.

On the other hand, in the case of using a multi-level modulation method such as QPSK or QAM, two or more codeword bits are transmitted in one carrier. Therefore, for each subcarrier that is influenced by external noise, two or more bits are eliminated. Therefore, when subcarriers are influenced by external noise, the number of eliminated bits differs between a subcarrier for which the tone map indicates use of a modulation method with a high modulation level and a subcarrier for which the tone map indicates use of a modulation method with a low modulation level. As the number of eliminated bits increases, decoding performance tends to worsen. In particular, when the number of eliminated bits is near the number of parity bits in the LDPC code, the decoding performance drastically degrades.

The communications device in Embodiment 2 attempts to improve decoding performance in an environment with external noise by observing the occurrence conditions of external noise and using a tone map that uses a modulation method with a low modulation level in subcarriers that are strongly influenced by external noise.

Figure 17:
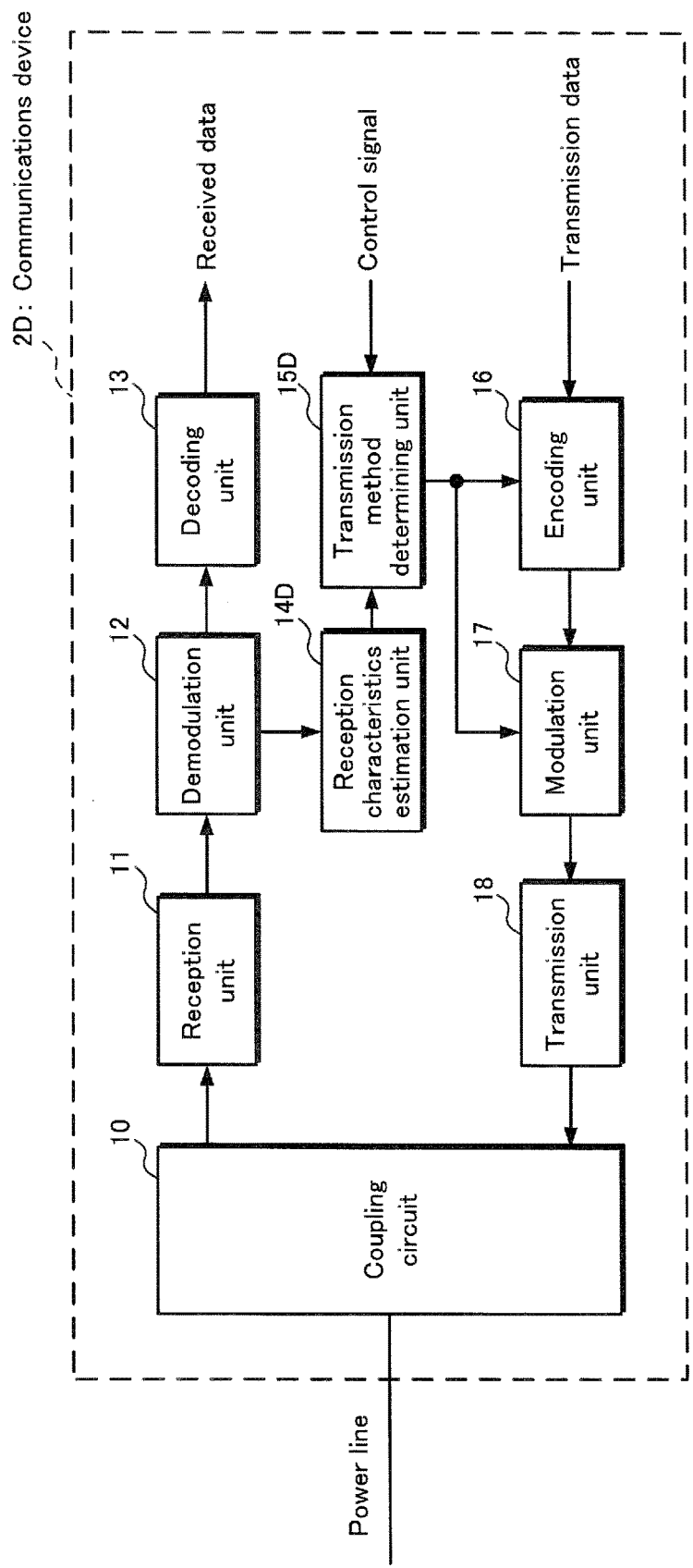
FIG. 17 shows the structure of the communications device 2D in Embodiment 2 of the present invention.

FIG. 17 shows the structure of a communications device 2D according to Embodiment 2, in which the communications device 2D has a function to change the tone map. The communications device 2D differs from the communications device 2 in that the reception characteristics estimation unit 14 and the transmission method determining unit 15 are respectively replaced by a reception characteristics estimation unit 14D and a transmission method determining unit 15D.

Figure 18:
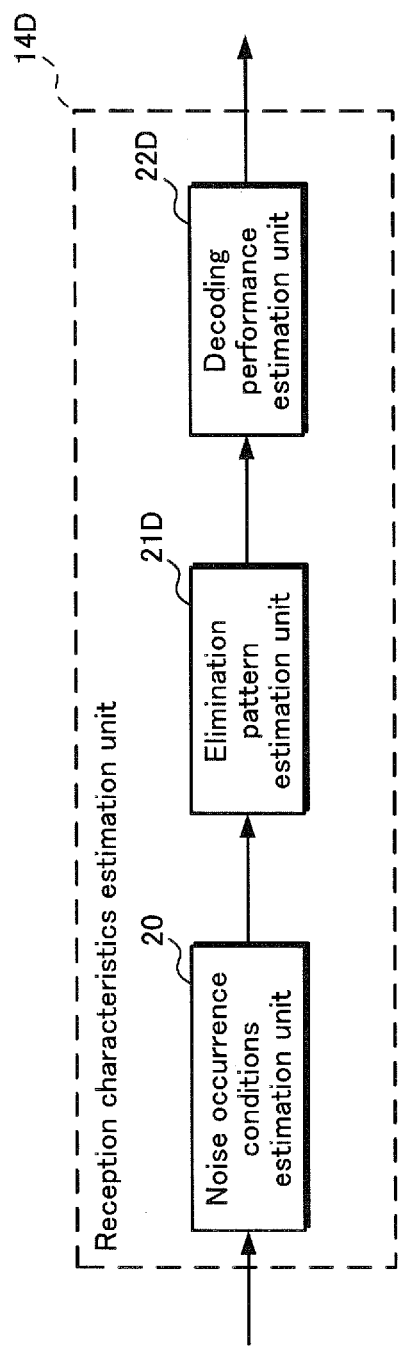
FIG. 18 shows the internal structure of the reception characteristics estimation unit 14D in FIG. 17.

The reception characteristics estimation unit 14D is provided with a noise occurrence conditions estimation unit 20, an elimination pattern estimation unit 21D, and a decoding performance estimation unit 22D, as shown in FIG. 18.

The elimination pattern estimation unit 21D creates a tone map in which the number of candidate elimination bits is reduced based on information, output by the noise occurrence conditions estimation unit 20, on the subcarriers influenced by external noise and information on the number of bits transmitted in one symbol of the multicarrier modulated signal. The elimination pattern estimation unit 21D estimates the elimination pattern when using the created tone map. The elimination pattern estimation unit 21D estimates the elimination pattern from the numbers of subcarriers influenced by external noise, the tone map designated by the modulation method for each subcarrier, the code length and the code rate of the LDPC code, and the interleaving pattern of the codeword bit sequence. The elimination pattern estimation unit 21D outputs the tone map in which the number of candidate elimination bits is reduced and the elimination pattern estimated using the tone map to the decoding performance estimation unit 22D.

The decoding performance estimation unit 22D estimates the decoding performance when decoding using the elimination pattern output by the elimination pattern estimation unit 21D. If the estimated decoding performance is good, the decoding performance estimation unit 22D outputs, to the transmission method determining unit 15D, a recommended transmission method that includes the tone map, the code length and code rate of the LDPC code, and the interleaving pattern of the codeword bit sequence that were the basis for creating the elimination pattern, and the parity check matrix used for estimation of the decoding performance.

The transmission method determining unit 15D determines the transmission method, which includes the tone map actually used when transmitting data, from (i) the recommended transmission method, which includes a tone map output by the reception characteristics estimation unit 14D with respect to every code length and code rate of the LDPC code and interleaving pattern of the codeword bit sequence that might be indicated by a control signal, and (ii) the instructions of the control signal that is input (the code length and code rate of the LDPC code and the interleaving pattern of the codeword bit sequence). The transmission method determining unit 15D then instructs the encoding unit 16 to perform LDPC encoding of transmission data using the code length, the code rate, and the parity check matrix of the LDPC code included in the determined transmission method. The transmission method determining unit 15D also instructs the modulation unit 17 to modulate each subcarrier in accordance with the tone map included in the determined transmission method.

The following describes operations by the communications device 2D for the noise level shown in FIG. 19. The communications device 2D is assumed to transmit 20 codeword bits in one symbol of a multicarrier modulated signal. In this case, if the parity check matrix H shown in Expression 1 is used, two codewords (codeword 1 and codeword 2) are transmitted in one symbol of a multicarrier modulated signal since the code length of the parity check matrix H is 10.

The noise occurrence conditions estimation unit 20 in the reception characteristics estimation unit 14D compares the noise level in each subcarrier shown by the signal for estimation of noise conditions with a noise threshold Nth. The noise occurrence conditions estimation unit 20 derives numbers of subcarriers having a higher noise level than the noise threshold Nth as fsc1, fsc2, ..., fscn. In the example in FIG. 19, the total number of subcarriers is 10. When providing subcarrier numbers 1, 2, ..., 10 in ascending order of frequency, fsc1=2, fsc2=4, fsc3=8, and fsc4=10. The noise occurrence conditions estimation unit 20 outputs information on subcarrier numbers having a higher noise level than the noise threshold Nth (in the example in FIG. 19, fsc1=2, fsc2=4, fsc3=8, and fsc4=10) to the elimination pattern estimation unit 21D as noise occurrence conditions.

In order to improve decoding performance when eliminations exist, the number of codeword bits that are transmitted over subcarrier numbers with a higher noise level than the noise threshold Nth should be reduced. Therefore, the elimination pattern estimation unit 21D creates a tone map that uses BPSK in subcarrier numbers 2, 4, 8, 10, QPSK in subcarrier numbers 1, 3, 7, and 9, and 16QAM in subcarrier numbers 5 and 6, and estimates the elimination pattern for each codeword.

Assuming that the codeword bit sequence is not interleaved, if the first codeword bit of codeword 1, the second codeword bit of codeword 1, ..., the tenth codeword bit of codeword 1, the first codeword bit of codeword 2, the second codeword bit of codeword 2, ..., and the tenth codeword bit of codeword 2 are allocated, in this order, to the created tone map starting from the smallest subcarrier number, then Expression 18 shows the elimination pattern of codeword 1, and Expression 19 shows the elimination pattern of codeword 2.

[Math 18]

$$[0,0,1,0,0,1,0,0,0,0] \qquad \text{Expression 18}$$

[Math 19]

$$[0,0,0,0,0,0,1,0,0,1] \qquad \text{Expression 19}$$

By using the above tone map created by the elimination pattern estimation unit 21D, the number of eliminated bits is fewer than when using QPSK, for example, in all of the subcarriers (which yields eight eliminated bits).

The elimination pattern estimation unit 21D outputs, to the decoding performance estimation unit 22D, the created tone map and the elimination pattern for each codeword (the elimination pattern for codeword 1 shown in Expression 18 and the elimination pattern for codeword 2 shown in Expression 19).

The decoding performance estimation unit 22D estimates decoding performance for each elimination pattern.

When using the parity check matrix H in Expression 1, the decoding performance estimation unit 22D extracts, from the parity check matrix H of Expression 1, only the columns (columns 3 and 6) corresponding to the codeword bits having a value of 1 in the elimination pattern of codeword 1 in Expression 18 output by the elimination pattern estimation unit 21D, and creates a partial matrix Hp1 from the extracted columns. Expression 20 illustrates the created partial matrix Hp1.

[Math 20]

$$Hp1 = \begin{pmatrix} 0 & 1 \\ 0 & 0 \\ 1 & 0 \\ 1 & 1 \\ 1 & 1 \end{pmatrix} \qquad \text{Expression 20}$$

The decoding performance estimation unit 22D extracts, from the parity check matrix H of Expression 1, only the columns (columns 7 and 10) corresponding to the codeword bits having a value of 1 in the elimination pattern of codeword 2 in Expression 19 output by the elimination pattern estimation unit 21D, and creates a partial matrix Hp2 from the extracted columns. Expression 21 illustrates the created partial matrix Hp2.

[Math 21]

$$Hp2 = \begin{pmatrix} 1 & 0 \\ 0 & 1 \\ 1 & 1 \\ 0 & 0 \\ 1 & 1 \end{pmatrix} \qquad \text{Expression 21}$$

In the partial matrix Hp1 shown in Expression 20 and the partial matrix Hp2 shown in Expression 21, no row has a row weight of one, and two rows have a row weight of two. Therefore the decoding performance not does drastically degrade (a predetermined decoding performance is achieved).

The decoding performance estimation unit 22D outputs, to the transmission method determining unit 15D, the recommended transmission method that includes the tone map that was the basis for the elimination patterns in Expressions 18 and 19.

As described above, the communications device 2D in Embodiment 2 reduces degradation of decoding performance during transmission in an environment with external noise by transmitting using a tone map that reduces the modulation level of subcarriers that are strongly influenced by external noise. Note that the communications device with the structure of FIG. 11 may be used as a communications device that performs PLC with the communications device 2D.

In the above description, the decoding performance is indicated as not drastically degrading in the partial matrices provided in Expressions 20 and 21 since two rows have a row weight of two. So as to achieve other partial matrices, however, a structure may be adopted to interleave the codeword. For example, if the codeword is interleaved so that the elimination pattern of codeword 1 provided by Expression 18 becomes as indicated in Expression 22, a partial matrix Hp3 becomes as indicated in Expression 23.

[Math 22]

$$[1, 0, 1, 0, 0, 0, 0, 0, 0, 0] \qquad \text{Expression 22}$$

[Math 23]

$$Hp3 = \begin{pmatrix} 1 & 0 \\ 1 & 0 \\ 1 & 1 \\ 0 & 1 \\ 0 & 1 \end{pmatrix} \qquad \text{Expression 23}$$

Since only one row of the partial matrix Hp3 has a row weight of 2, a transmission method that includes the tone map and interleaving pattern that achieve this partial matrix is output to the transmission method determining unit 15D as the recommended transmission method. The same is true for the elimination pattern of codeword 2.

Note that the partial matrix Hp1 and the partial matrix Hp3 both prevent drastic degradation since neither forms a stopping set. When eliminated bits are included, the decoding performance is not necessarily better with the partial matrix Hp3. Therefore, a structure may be adopted to verify decoding performance in advance, via a simulation or the like, for a plurality of transmission methods for which elimination patterns do not form stopping sets, as in the case of the partial matrices Hp1 and Hp3, and then for the decoding performance estimation unit 22D to notify the transmission method determining unit 15D of the recommended transmission method by determining, based on the verification, which transmission method has higher decoding performance.

Note that in Embodiment 2, a structure is adopted in which the elimination pattern estimation unit 21D estimates a tone map in which the number of candidate elimination bits is reduced and an elimination pattern when using the estimated tone map, but the present invention is not limited to this structure. For example, the elimination pattern estimation unit 21D may estimate the code length and the code rate in addition to the tone map in which the number of candidate elimination bits is reduced and then estimate the elimination pattern when using the estimated tone map, the code length, and the code rate. This structure not only changes the tone map, but also the type of encoding, such as the code length and the code rate, thereby increasing the degree of freedom when estimating the transmission method with little degradation of decoding performance.

In Embodiment 2, a structure has been described in which the elimination pattern estimation unit 21D creates a tone map using BPSK for all subcarriers that are estimated as being influenced by external noise, but the present invention is not limited to this structure.

For example, the elimination pattern estimation unit 21D may create a tone map such that the modulation level of the modulation method for the subcarriers influenced by strong external noise is lower than the modulation level of the modulation method for the subcarriers not influenced by strong external noise.

As another example, a structure may be adopted wherein the elimination pattern estimation unit 21D creates an elimination pattern for when a multi-level modulation method such as QPSK is used in a portion of the subcarriers estimated to be influenced by external noise, and when the decoding performance estimation unit 22D determines, by evaluating the decoding performance for the elimination pattern, that degradation of decoding performance is within a tolerable range, a multi-level modulation method such as QPSK is used in a portion of the subcarriers estimated to be influenced by external noise. With this structure, the number of bits transmitted in one symbols increases, thus improving transmission efficiency.

When thus using a multi-level modulation method such as QPSK in subcarriers estimated to be influenced by external noise, the number of candidate elimination bits for which degradation of decoding performance is tolerable may be calculated in advance and set as a threshold. The elimination pattern estimation unit 21D may then estimate a tone map using a multi-level modulation method such as QPSK in subcarriers estimated to be influenced by external noise such that the number of candidate elimination bits in one codeword, or the number of candidate elimination bits per symbol, is within a range not exceeding the threshold.

Embodiment 2 is an example of a structure in which, when using BPSK in the subcarriers estimated by the elimination pattern estimation unit 21D to be influenced by external noise, 16QAM is used in at least a portion of subcarriers in which the influence of external noise is small, so that the number of codeword bits transmitted in one symbol is N times the code length (N being any natural number; in Embodiment 2, N=2). With this structure, when a plurality of symbols are transmitted successively, since N codewords are mapped in the subcarriers by the same mapping rule in any symbol, then the same N types of elimination patterns are estimated for codewords transmitted by any symbol (in the case of Embodiment 2, the two elimination patterns indicated in Expressions 18 and 19) if the transmission method that is used is the same. Therefore, the reception characteristics estimation unit 14D can determine the recommended transmission method only taking into consideration the estimated N types of elimination patterns, thus simplifying estimation of the recommended transmission method. In this case, as in Embodiment 2, the reception characteristics estimation unit 14D may notify the transmission method determining unit 15D of one transmission method, as the recommended transmission method, for which degradation of decoding performance is small for any of N types of elimination patterns. Alternatively, the reception characteristics estimation unit 14D may estimate a parity check matrix for which degradation of decoding performance is small for every N elimination patterns and notify the transmission method determining unit 15D of the parity check matrix as the recommended transmission method, and the transmission method determining unit 15D may then change the parity check matrix for every codeword.

Note that Embodiment 2 is not limited to a structure in which the number of codeword bits transmitted in one symbol is N times the code length. For example, the number of codeword bits transmitted in one symbol may be 1/M times the code length (M being any natural number). In this case, one codeword is mapped in subcarriers of M symbols by the same mapping rule. Therefore, the elimination pattern that is estimated for a codeword transmitted in any of the M symbols is always the same. With this structure, if the reception characteristics estimation unit 14D estimates one transmission method with little degradation of decoding performance for an estimated elimination pattern and notifies the transmission method determining unit 15D of the estimated transmission method as a recommended transmission method, degradation of decoding performance can be limited for every codeword, thus simplifying estimation of the recommended transmission method.

Furthermore, Embodiment 2 may be a structure in which the number of codewords bits transmitted in a symbol and the code length are not in a relationship where one is divided by the other. In this case, since the mapping rule for mapping codewords in subcarriers differs for each symbol, the elimination pattern differs for each codeword even if the same transmission method is used. The elimination pattern of each codeword, however, can be calculated based on the tone map and the interleaving pattern, and therefore the reception characteristics estimation unit 14D may determine the recommended transmission method by taking into consideration a plurality of types of elimination patterns estimated for each transmitted codeword. The reception characteristics estimation unit 14D in this case may notify the transmission method determining unit 15D of one recommended transmission method, for which degradation of decoding performance is small for all of the estimated elimination patterns, as the recommended transmission method. Alternatively, the reception characteristics estimation unit 14D may estimate, as the recommended transmission method, a transmission method for which degradation of decoding performance is small for each codeword and notify the transmission method determining unit 15D of the recommended transmission method, and the transmission method determining unit 15D may then change the transmission method for each codeword.

In Embodiments 1 and 2, an example has been described of a structure in which a transmission signal is a signal that has undergone multicarrier modulation, but the present invention may be adapted to a communications device that uses single carrier modulation. For example, in an environment in which strong external noise occurs at specific time intervals, it is predicted that candidate elimination bits will occur in a cycle corresponding to the intervals of occurrence of external noise. Therefore, the reception characteristics estimation unit 14 and the like may be structured to estimate the elimination pattern to be a combination of codeword bits mapped in the cycle corresponding to the intervals of occurrence of external noise. In this case, it is predicted that a plurality of combinations exist of codeword bits mapped in the cycle corresponding to the intervals of occurrence of external noise, and that the resulting elimination pattern differs depending on the relationship between the timing at which external noise occurs and the timing of the start of transmission of the modulated signal. Therefore, in this case the reception characteristics estimation unit 14 and the like estimate the transmission method for which degradation of decoding performance is small for any of the plurality of elimination patterns and notifies the transmission method determining unit 15 and the like of the estimated transmission method as the recommended transmission method.

Note that in Embodiment 1, improvement of decoding performance is sought by changing the elimination pattern as a result of changing the parity check matrix, the interleaving pattern of the codeword bit sequence, or the like, whereas in Embodiment 2, improvement of decoding performance is sought by reducing the number of candidate elimination bits as a result of changing the tone map so that the modulation method of subcarriers influenced by strong external noise is set to BPSK, which has the smallest modulation level. However, the present invention is not limited in this way, and may for example be as follows. In some cases, depending on the combination of positions of candidate elimination bits in the codeword, good decoding performance may be achieved when changing the tone map even if the elimination pattern changes such that the number of candidate elimination bits does not change or increases. Therefore, an elimination pattern may be estimated for each of a plurality of tone maps (for example, a plurality of tone maps in which the number of subcarriers designated for each modulation method is the same), and a tone map with good decoding performance may then be used.

Note also that in Embodiments 1 and 2, the PLC system shown for communications systems 1 and 1C has been described, but the present invention is also applicable to a wireless communications system such as a wireless LAN.

Each functional block provided for the communications devices (the communications device at the transmitting end and the communications device at the receiving end) described in Embodiments 1 and 2 and the modifications thereto are typically implemented as an LSI, which is an integrated circuit. Individual functional blocks may respectively be made into discrete chips, or part or all may be made into one chip. While an LSI has been referred to, the terms IC, system LSI, super LSI, or ultra LSI may be used depending on the degree of integration. Furthermore, the method of integration is not limited to LSI, and a dedicated circuit or a general-purpose processor may be used. A Field Programmable Gate Array (FPGA), which is programmable after the LSI is manufactured, or a reconfigurable processor, which allows reconfiguration of the connections and settings of circuit cells inside the LSI, may be used. Furthermore, if technology for forming integrated circuits that replaces LSIs emerges, owing to advances in semiconductor technology or to another derivative technology, the integration of functional blocks may naturally be accomplished using such technology. The application of biotechnology or the like is possible.

INDUSTRIAL APPLICABILITY

The communications device, reception device, transmission method, and reception method according to the present invention are useful in communications devices and the like for digital communications in an environment with external noise.

REFERENCE SIGNS LIST 1 communications system
2 communications device
3 communications device
4 noise source
5 power line
10 coupling circuit
11 reception unit
12 demodulation unit
13 decoding unit
14 reception characteristics estimation unit
15 transmission method determining unit
16 encoding unit
17 modulation unit
18 transmission unit
20 noise occurrence conditions estimation unit
21 elimination pattern estimation unit
22 decoding performance estimation unit
30 coupling circuit
31 reception unit
32 demodulation unit
33 decoding unit

The invention claimed is:

1. A transmission device transmitting transmission data by a transmission scheme selected from a plurality of transmission schemes, the transmission device comprising:
a determiner for determining one transmission scheme from the plurality of transmission schemes;
an encoder encoding the transmission data to generate a first codeword bit sequence, the encoding using a low-density parity-check (LDPC) encoding scheme selected from a plurality of LDPC encoding schemes that differ from each other in at least one of code length and code rate;
an elimination pattern estimator estimating, based on occurrence conditions of external noise, an elimination pattern that indicates positions in codewords of elimination candidate bits and number of elimination candidate bits, where an elimination candidate bit is a codeword bit that has a high probability of being eliminated prior to decoding by a receiving device among codeword bits that constitute a codeword bit sequence generated by the encoding;
an interleaver interleaving a sequence of bits in the first codeword bit sequence to generate a second codeword bit sequence, the interleaving using an interleaving pattern selected from a plurality of predefined interleaving patterns that are bit interleaving rules that differ from each other;
a modulator mapping bit units each composed of a predetermined number of bits included in the second codeword bit sequence to generate a plurality of modulation symbols, the mapping using a modulation scheme selected from a plurality of modulation schemes that differ from each other; and
a transmitter transmitting a transmission signal including a plurality of control symbols and the plurality of modulation symbols, the control symbols being generated from control information indicating the LDPC encoding scheme, the interleaving pattern, and the modulation scheme used for generating the plurality of modulation symbols, wherein
the transmission schemes include a first transmission scheme and a second transmission scheme, the first transmission scheme using a first LDPC encoding scheme, a first interleaving pattern, and a first modulation scheme, and the second transmission scheme using the first LDPC encoding scheme, a second interleaving pattern, and the first modulation scheme, the second interleaving pattern being different from the first interleaving pattern, and the determiner switches the first interleaving pattern to the second interleaving pattern when decoding performance is poor according to the elimination pattern estimated by the elimination pattern estimator.

2. A transmission method of transmitting transmission data by a transmission scheme selected from a plurality of transmission schemes, the transmission method comprising:
determining one transmission scheme from the plurality of transmission schemes;
encoding the transmission data to generate a first codeword bit sequence, the encoding using a low-density parity-check (LDPC) encoding scheme selected from a plurality of LDPC encoding schemes that differ from each other in at least one of code length and code rate;
estimating, based on occurrence conditions of external noise, an elimination pattern that indicates positions in codewords of elimination candidate bits and number of elimination candidate bits, where an elimination candidate bit is a codeword bit that has a high probability of being eliminated prior to decoding by a receiving device among codeword bits that constitute a codeword bit sequence generated by the encoding;
interleaving a sequence of bits in the first codeword bit sequence to generate a second codeword bit sequence, the interleaving using an interleaving pattern selected from a plurality of predefined interleaving patterns that are bit interleaving rules that differ from each other;
mapping bit units each composed of a predetermined number of bits included in the second codeword bit sequence to generate a plurality of modulation symbols, the mapping using a modulation scheme selected from a plurality of modulation schemes that differ from each other; and
transmitting a transmission signal including a plurality of control symbols and the plurality of modulation symbols, the control symbols being generated from control information indicating the LDPC encoding scheme, the interleaving pattern, and the modulation scheme used for generating the plurality of modulation symbols, wherein
the transmission schemes include a first transmission scheme and a second transmission scheme, the first transmission scheme using a first LDPC encoding scheme, a first interleaving pattern, and a first modulation scheme, and the second transmission scheme using the first LDPC encoding scheme, a second interleaving pattern, and the first modulation scheme, the second interleaving pattern being different from the first interleaving pattern, and
the first interleaving pattern is switched to the second interleaving pattern when decoding performance is poor according to the elimination pattern estimated in said estimating.

3. A receiving device receiving a transmission signal transmitted by using a transmission scheme selected from a plurality of transmission schemes, wherein
the transmission signal includes a plurality of control symbols and a plurality of modulation symbols,
the modulation symbols are generated by mapping bit units each composed of a predetermined number of bits included in a second codeword bit sequence by using a modulation scheme selected from a plurality of modulation schemes that differ from each other,
the second codeword bit sequence is generated by interleaving a sequence of bits in a first codeword bit sequence by using an interleaving pattern selected from a plurality of predefined interleaving patterns that are bit interleaving rules that differ from each other,
the first codeword bit sequence is generated by encoding transmission data by using a low-density parity-check (LDPC) encoding scheme selected from a plurality of LDPC encoding schemes that differ from each other in at least one of code length and code rate,
the control symbols are generated from control information indicating the LDPC encoding scheme, the interleaving pattern, and the modulation scheme used for generating the plurality of modulation symbols,
the transmission schemes include a first transmission scheme and a second transmission scheme, the first transmission scheme using a first LDPC encoding scheme, a first interleaving pattern, and a first modulation scheme, and the second transmission scheme using the first LDPC encoding scheme, a second interleaving pattern, and the first modulation scheme, the second interleaving pattern being different from the first interleaving pattern,
an elimination pattern is estimated that indicates positions in codewords of elimination candidate bits and number of elimination candidate bits based on occurrence conditions of external noise, where an elimination candidate bit is a codeword bit that has a high probability of being eliminated prior to decoding by the receiving device among codeword bits that constitute a codeword bit sequence generated by the encoding,
the first interleaving pattern is switched to the second interleaving pattern when decoding performance is poor according to the elimination pattern estimated, and
the receiving device comprises a decoder that decodes the control information.

4. A receiving method of receiving a transmission signal transmitted by using a transmission scheme selected from a plurality of transmission schemes, wherein
the transmission signal includes a plurality of control symbols and a plurality of modulation symbols,
the modulation symbols are generated by mapping bit units each composed of a predetermined number of bits included in a second codeword bit sequence by using a modulation scheme selected from a plurality of modulation schemes that differ from each other,
the second codeword bit sequence is generated by interleaving a sequence of bits in a first codeword bit sequence by using an interleaving pattern selected from a plurality of predefined interleaving patterns that are bit interleaving rules that differ from each other,
the first codeword bit sequence is generated by encoding transmission data by using a low-density parity-check (LDPC) encoding scheme selected from a plurality of LDPC encoding schemes that differ from each other in at least one of code length and code rate,
the control symbols are generated from control information indicating the LDPC encoding scheme, the interleaving pattern, and the modulation scheme used for generating the plurality of modulation symbols,
the transmission schemes include a first transmission scheme and a second transmission scheme, the first transmission scheme using a first LDPC encoding scheme, a first interleaving pattern, and a first modulation scheme, and the second transmission scheme using the first LDPC encoding scheme, a second interleaving pattern, and the first modulation scheme, the second interleaving pattern being different from the first interleaving pattern, an elimination pattern is estimated that indicates positions in codewords of elimination candidate bits and number of elimination candidate bits based on occurrence conditions of external noise, where an elimination candidate bit is a codeword bit that has a high probability of being eliminated prior to decoding by the receiving device among codeword bits that constitute a codeword bit sequence generated by the encoding, the first interleaving pattern is switched to the second interleaving pattern when decoding performance is poor according to the elimination pattern estimated, and the receiving method comprises generating reception data by decoding the control information.

* * * * *